US012745568B2

(12) United States Patent
Park et al.

(10) Patent No.: US 12,745,568 B2
(45) Date of Patent: Sep. 22, 2026

(54) MAGNETIC MEMORY DEVICE AND METHOD FOR FABRICATING THE SAME

(71) Applicant: Samsung Electronics Co., Ltd., Suwon-si (KR)

(72) Inventors: Jun Ho Park, Suwon-si (KR); Byoung Jae Bae, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 371 days.

(21) Appl. No.: 18/505,152

(22) Filed: Nov. 9, 2023

(65) Prior Publication Data

US 2024/0349615 A1 Oct. 17, 2024

(30) Foreign Application Priority Data

Apr. 12, 2023 (KR) ........................ 10-2023-0048156

(51) Int. Cl.

| | |
|---|---|
| ***H10N 50/01*** | (2023.01) |
| ***G11C 11/16*** | (2006.01) |
| ***H10B 61/00*** | (2023.01) |
| ***H10N 50/10*** | (2023.01) |
| ***H10N 50/80*** | (2023.01) |

(52) U.S. Cl.

CPC ........... *H10N 50/01* (2023.02); *G11C 11/161* (2013.01); *H10B 61/00* (2023.02); *H10N 50/10* (2023.02); *H10N 50/80* (2023.02)

(58) Field of Classification Search

CPC ....... G11C 11/16; G11C 11/161; H10B 61/00; H10B 61/10; H10B 61/22; H10N 50/01; H10N 50/10; H10N 59/00

See application file for complete search history.

(56) References Cited

U.S. PATENT DOCUMENTS

| | | | | |
|---|---|---|---|---|
| 9,166,154 | B2 | 10/2015 | Satoh et al. | |
| 9,564,582 | B2 | 2/2017 | Pakala et al. | |
| 9,608,040 | B2 | 3/2017 | Baek et al. | |
| 10,454,021 | B2 | 10/2019 | Sung et al. | |
| 10,707,413 | B1 * | 7/2020 | Dutta | H10N 50/01 |
| 10,833,258 | B1 | 11/2020 | Dutta et al. | |
| 11,031,548 | B2 | 6/2021 | Shen et al. | |
| 2016/0336509 | A1 * | 11/2016 | Jeong | H10N 50/01 |
| 2017/0345869 | A1 * | 11/2017 | Park | G11C 11/161 |
| 2021/0104671 | A1 * | 4/2021 | Song | H10N 70/826 |
| 2022/0336731 | A1 | 10/2022 | Yang et al. | |

* cited by examiner

*Primary Examiner* — Fazli Erdem

(74) *Attorney, Agent, or Firm* — Wolf, Greenfield & Sacks, P.C.

(57) ABSTRACT

A magnetic memory device and a method for fabricating the same are provided. The magnetic memory device includes a substrate, a lower insulating layer on the substrate, a memory cell including a first magnetic pattern, a tunnel barrier pattern and a second magnetic pattern, which are sequentially stacked on the lower insulating layer, and a re-deposition insertion layer extending along an upper surface of the lower insulating layer from a side of the memory cell, wherein the re-deposition insertion layer includes a re-deposition insulating layer, a mixed layer and a re-deposition byproduct layer, which are sequentially stacked on the lower insulating layer, and the mixed layer includes both a material included in the re-deposition insulating layer and a material included in the re-deposition byproduct layer.

20 Claims, 25 Drawing Sheets

FIG. 1

MAGNETIC MEMORY DEVICE AND METHOD FOR FABRICATING THE SAME

CROSS-REFERENCE TO RELATED APPLICATION

This application claims priority under 35 U.S.C. § 119 to Korean Patent Application No. 10-2023-0048156 filed on Apr. 12, 2023, in the Korean Intellectual Property Office, the disclosure of which, in its entirety, is hereby incorporated by reference.

BACKGROUND

The present disclosure relates to a magnetic memory device and a method for fabricating the same.

With high-speed and low-power of electronic devices, a memory device embedded in an electronic device with fast read/write operations and low operating voltages may be desirable. A magnetic memory device has been studied as a memory device that satisfies such properties/characteristics. The magnetic memory device is non-volatile and enables high-speed operation, and thus has been spotlighted as a next-generation memory.

Meanwhile, as a magnetic memory device is increasingly highly integrated, STT-MRAM for storing information using a spin transfer torque (STT) phenomenon is being studied. The STT-MRAM may induce a magnetization reversal by applying a direct current to a magnetic tunnel junction element to store information. The highly integrated STT-MRAM with high-speed operation and low current operation may be beneficial.

BRIEF SUMMARY

An object of the present disclosure is to provide a magnetic memory device with improved reliability.

Another object of the present disclosure is to provide a method for fabricating a magnetic memory device with improved reliability.

The objects of the present disclosure are not limited to those mentioned above and additional objects of the present disclosure, which are not mentioned herein, will be clearly understood by those skilled in the art from the following description of the present disclosure.

According to aspects of the present disclosure, there is provided a magnetic memory device comprising a substrate, a lower insulating layer on the substrate, a memory cell including a first magnetic pattern, a tunnel barrier pattern and a second magnetic pattern, which are sequentially stacked on the lower insulating layer, and a re-deposition insertion layer extending along an upper surface of the lower insulating layer from a side of the memory cell, wherein the re-deposition insertion layer includes a re-deposition insulating layer, a mixed layer and a re-deposition byproduct layer, which are sequentially stacked on the lower insulating layer, and the mixed layer includes both a material included in the re-deposition insulating layer and a material included in the re-deposition byproduct layer.

According to aspects of the present disclosure, there is provided a magnetic memory device comprising a substrate, a lower insulating layer on the substrate, a first memory cell and a second memory cell spaced apart from each other on the lower insulating layer, each of the first memory cell and the second memory cell including a first magnetic pattern, a tunnel barrier pattern and a second magnetic pattern sequentially stacked on the lower insulating layer, a bottom byproduct layer on an upper surface of the lower insulating layer between the first memory cell and the second memory cell, a re-deposition insulating layer on the bottom byproduct layer, and a re-deposition byproduct layer on the re-deposition insulating layer, the re-deposition byproduct layer being separated from the bottom byproduct layer by the re-deposition insulating layer.

According to aspects of the present disclosure, there is provided a magnetic memory device comprising a substrate, a lower insulating layer on the substrate, a first memory cell and a second memory cell spaced apart from each other on the lower insulating layer, and a re-deposition insertion layer extending along an upper surface of the lower insulating layer between the first memory cell and the second memory cell, a capping passivation layer extending along a side of each of the first memory cell and the second memory cell and an upper surface of the re-deposition insertion layer, and a filling insulating layer that is on the capping passivation layer and is in (e.g., fill) a space between the first memory cell and the second memory cell, wherein each of the first memory cell and the second memory cell includes a bottom electrode pattern, a first magnetic pattern, a tunnel barrier pattern, a second magnetic pattern and a top electrode pattern, which are sequentially stacked on the lower insulating layer, the re-deposition insertion layer includes a re-deposition insulating layer, a mixed layer and a re-deposition byproduct layer, which are sequentially stacked on the lower insulating layer, and the mixed layer includes both a material included in the re-deposition insulating layer and a material included in the re-deposition byproduct layer.

According to aspects of the present disclosure, there is provided a method for fabricating a magnetic memory device, the method comprising forming a lower insulating layer on a substrate, sequentially forming a first magnetic layer, a tunnel barrier layer and a second magnetic layer on the lower insulating layer, forming a memory cell including a first magnetic pattern, a tunnel barrier pattern and a second magnetic pattern by pattering the first magnetic layer, the tunnel barrier layer and the second magnetic layer, forming a capping insulating layer extending along a side of the memory cell and an upper surface of the lower insulating layer, and forming a re-deposition insertion layer extending along the upper surface of the lower insulating layer from the side of the memory cell by performing an etching process for the side of the memory cell, wherein the re-deposition insertion layer includes a material included in the capping insulating layer.

BRIEF DESCRIPTION OF DRAWINGS

The above and other aspects and features of the present inventive concept will become more apparent by describing in detail some example embodiments thereof with reference to the attached drawings, in which:

FIG. 1 is an example block view illustrating a magnetic memory device according to some embodiments.

DETAILED DESCRIPTION

Figure 2:
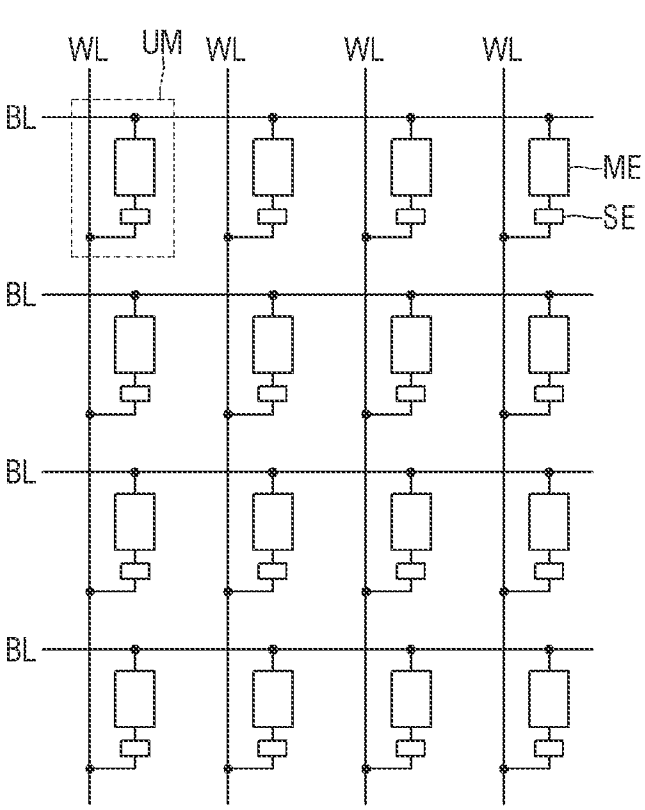
FIG. 2 is an example circuit view illustrating a cell array of a magnetic memory device according to some embodiments.

Hereinafter, a magnetic memory device according to some example embodiments will be described with reference to FIGS. 1 to 6B.

Figure 1:
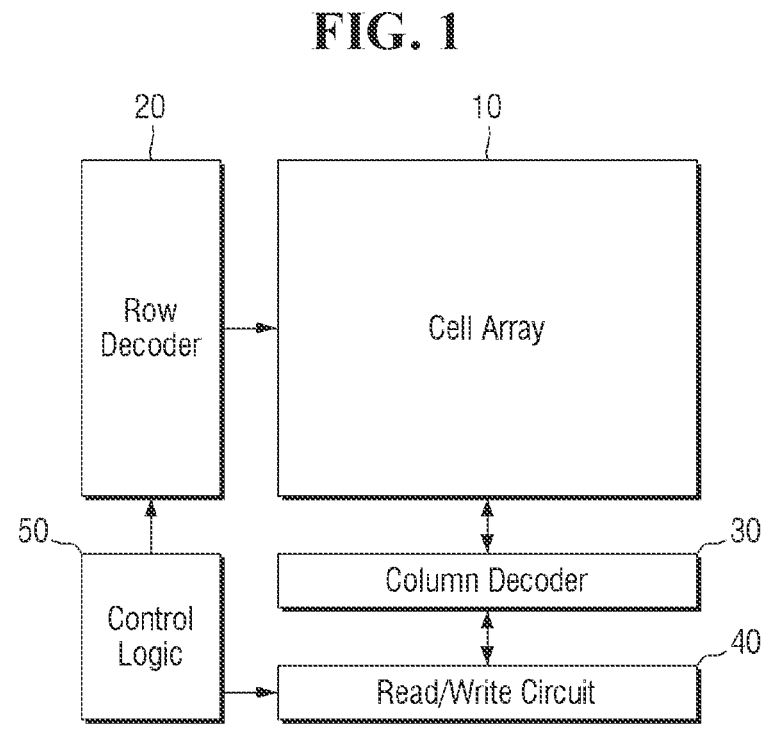

FIG. 1 is an example block view illustrating a magnetic memory device according to some embodiments.

Referring to FIG. 1, a magnetic memory device according to some embodiments includes a cell array 10, a row decoder 20, a column decoder 30, a read/write circuit 40 and a control logic 50.

The cell array 10 may include a plurality of word lines and a plurality of bit lines. Memory cells may be connected to points where the word lines cross the bit lines. The cell array 10 will be described in more detail with reference to FIG. 2.

The row decoder 20 may be connected to the cell array 10 through the word lines. The row decoder 20 may select one of the plurality of word lines by decoding an address input from the outside.

The column decoder 30 may be connected to the cell array 10 through the bit lines. The column decoder 30 may select one of the plurality of bit lines by decoding the address input from the outside. The bit line selected by the column decoder 30 may be connected to the read/write circuit 40.

The read/write circuit 40 may provide a bit line bias for accessing a selected memory cell under the control of the control logic 50. For example, the read/write circuit 40 may provide the bit line bias to the selected bit line to write or read input data in or from the memory cell.

The control logic 50 may output control signals for controlling the magnetic memory device in accordance with a command signal provided from the outside. The control signals output from the control logic 50 may control the read/write circuit 40.

FIG. 2 is an example circuit view illustrating a cell array of a magnetic memory device according to some embodiments.

Referring to FIG. 2, the cell array 10 includes a plurality of bit lines BL, a plurality of word lines WL and a plurality of unit memory cells UM.

The word lines WL may be extended in a first direction. The bit lines BL may be extended in a second direction crossing the first direction, thereby crossing the word lines WL.

The unit memory cells UM may be two-dimensionally or three-dimensionally arranged. Each of the unit memory cells may be connected to crossing points where the word lines WL cross the bit lines BL. Each of the unit memory cells UM connected to the word lines WL may be connected to the read/write circuit (e.g., the Read/Write Circuit 40 of FIG. 1) by the bit lines BL. Each of the unit memory cells UM may include a magnetic tunnel junction element ME and a selection element SE.

The magnetic tunnel junction element ME may be connected between the bit line BL and the selection element SE, and the selection element SE may be connected between the magnetic tunnel junction element ME and the word line WL. The magnetic tunnel junction element ME may include a reference layer, a free layer and a tunnel barrier layer. The magnetic tunnel junction element ME will be described in more detail with reference to FIGS. 3 to 6B.

The selection element SE may be configured to selectively control a flow of charges passing through the magnetic tunnel junction element ME. For example, the selection element SE may include at least one of a diode, a PNP bipolar transistor, an NPN bipolar transistor, an NMOS field effect transistor or a PMOS field effect transistor. When the selection element SE includes a bipolar transistor, which is a three-terminal element, or a MOS field effect transistor, an additional line (for example, a source line) may be connected to the selection element SE.

Figure 3:
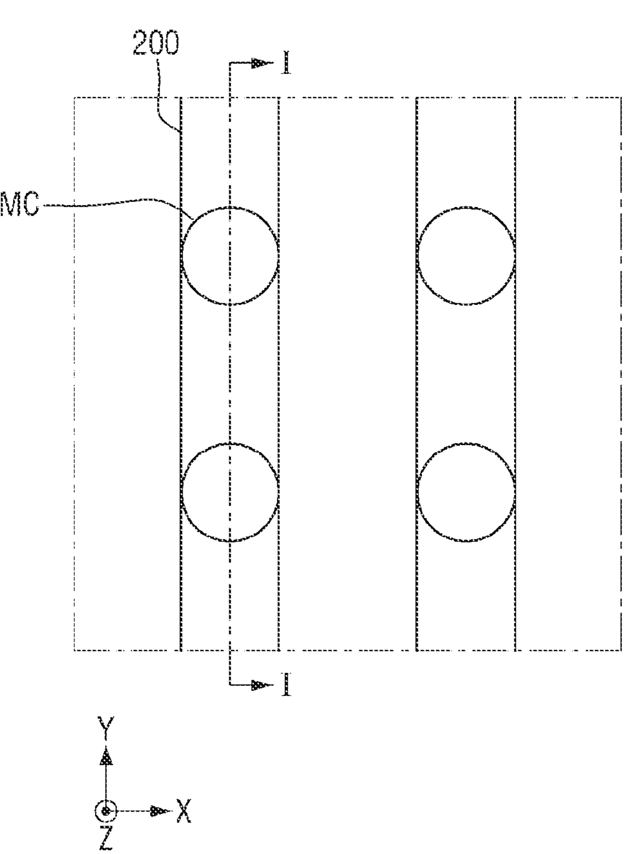
FIG. 3 is an example layout view illustrating a magnetic memory device according to some embodiments.
Figure 4:
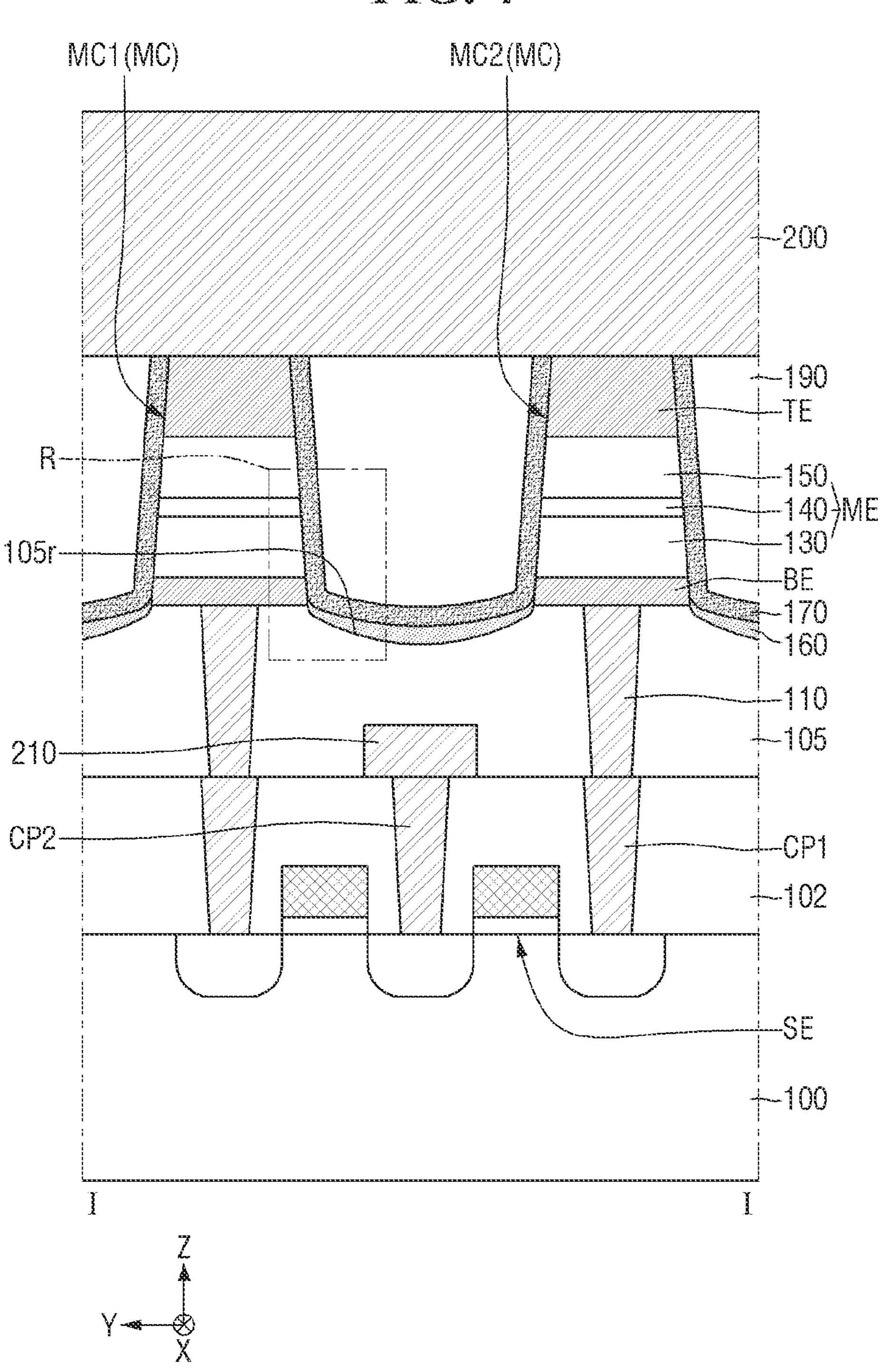
FIG. 4 is a cross-sectional view taken along line I-I of FIG. 3 according to some embodiments.
Figure 5A:
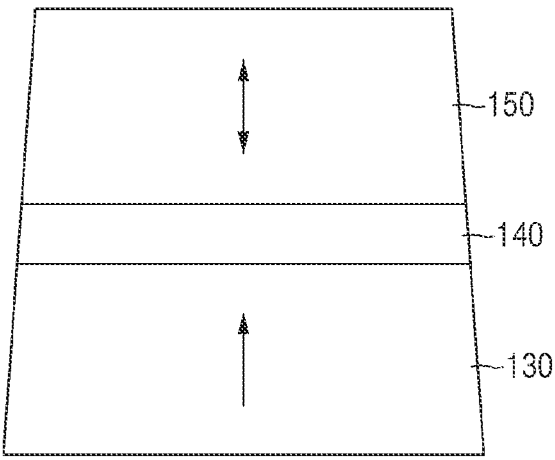
FIGS. 5A and 5B are cross-sectional views illustrating a magnetic tunnel junction element of FIG. 4 according to some embodiments.
Figure 5B:
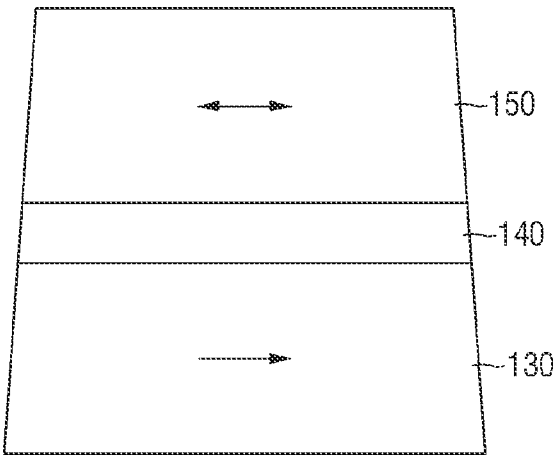
Figure 6A:
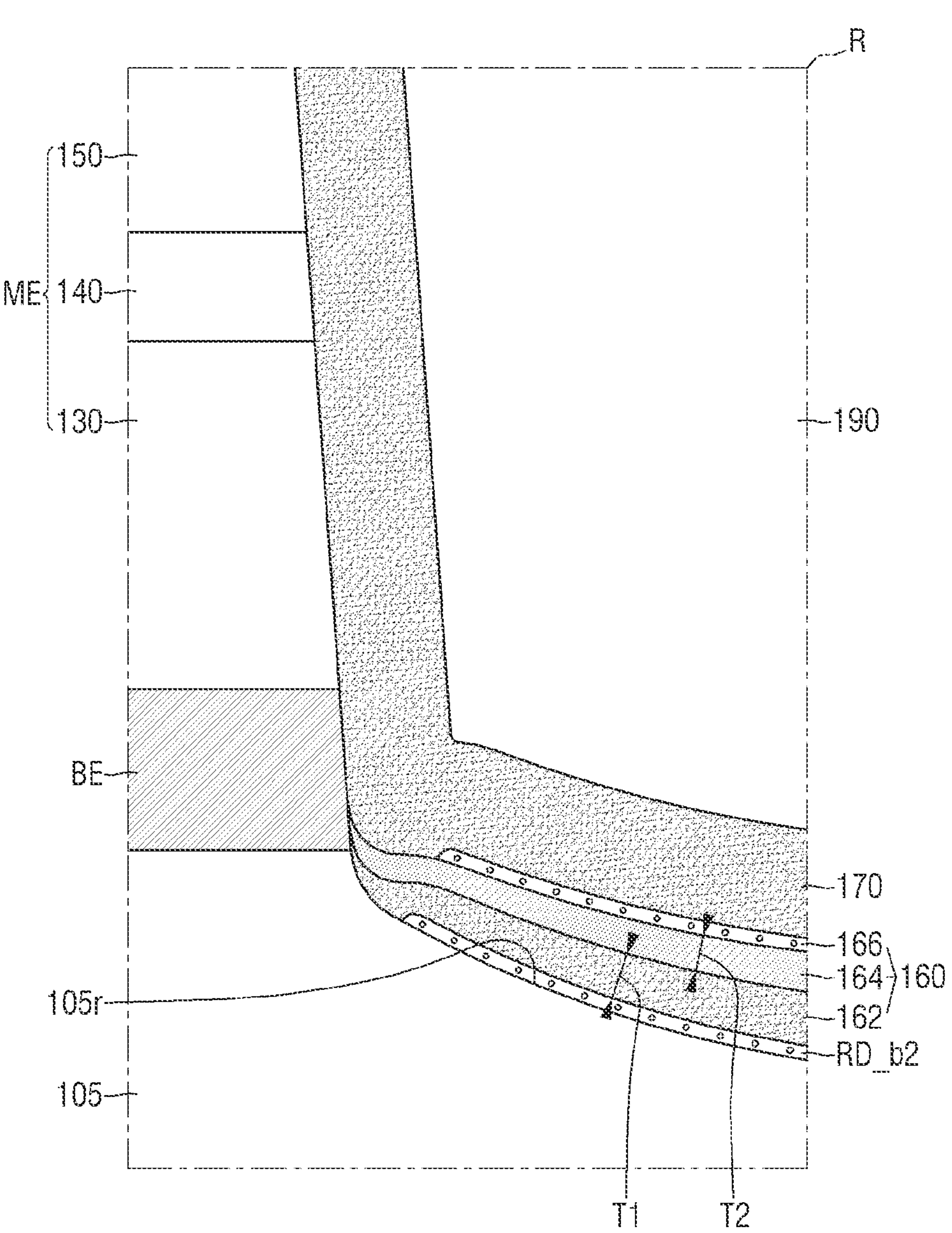
FIGS. 6A and 6B are enlarged views illustrating a region R of FIG. 4 according to some embodiments.
Figure 6B:
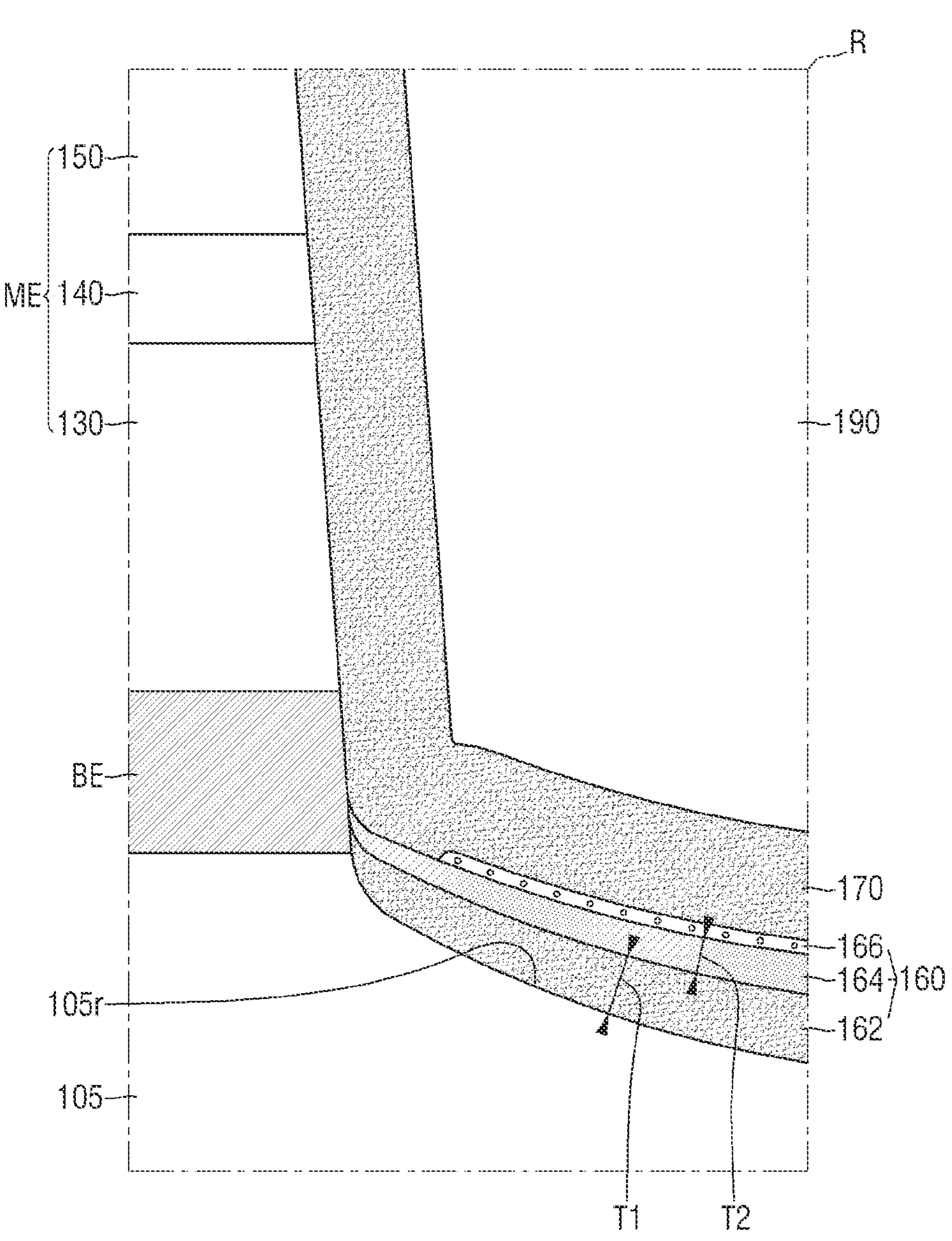

FIG. 3 is an example layout view illustrating a magnetic memory device according to some embodiments. FIG. 4 is a cross-sectional view taken along line I-I of FIG. 3 according to some embodiments. FIGS. 5A and 5B are cross-sectional views illustrating a magnetic tunnel junction element of FIG. 4 according to some embodiments. FIGS. 6A and 6B are enlarged views illustrating a region R of FIG. 4 according to some embodiments.

Referring to FIGS. 3 to 6B, the magnetic memory device according to some embodiments includes a substrate 100, a selection element SE, an interlayer insulating layer 102, a lower insulating layer 105, a contact plug 110, a plurality of memory cells MC, a re-deposition inserting layer 160, a capping passivation layer 170, a filling insulating layer 190, a first conductive line 200 and a second conductive line 210.

The substrate 100 may be, for example, a silicon substrate, a gallium arsenide substrate, a silicon germanium substrate, a ceramic substrate, a quartz substrate, a glass substrate for a display or the like, or may be a semiconductor on insulator (SOI) substrate, but is not limited thereto.

The selection element SE may be formed on the substrate 100. The selection element SE is shown as being a MOS field effect transistor, but this is only example. In some embodiments, a diode or bipolar transistor may constitute the selection element SE. A gate electrode of the selection element SE may be provided as a word line (e.g., the word line WL of FIG. 2).

The interlayer insulating layer 102 may be formed on the substrate 100. The interlayer insulating layer 102 may cover the selection element SE. The interlayer insulating layer 102 may include, for example, silicon oxide or silicon oxynitride, but is not limited thereto.

The lower insulating layer 105 may be formed on the interlayer insulating layer 102. The lower insulating layer 105 may include, for example, silicon oxide or silicon oxynitride, but is not limited thereto.

The contact plug 110 may be formed in the lower insulating layer 105. The contact plug 110 may be extended in a vertical direction (e.g., a third direction Z) crossing an upper surface of the substrate 100 to pass through the lower insulating layer 105. The contact plug 110 may include, but is not limited to, at least one of a conductive material, for example, a doped semiconductor material (e.g., doped silicon), a metal (e.g., tungsten, aluminum, copper, titanium and/or tantalum), a conductive metal nitride (e.g., titanium nitride, tantalum nitride and/or tungsten nitride) or a metal-semiconductor compound (e.g., metal silicide).

The plurality of memory cells MC may be formed on the lower insulating layer 105 and the contact plug 110. The plurality of memory cells MC may be spaced apart from each other. For example, the plurality of memory cells MC may be arranged in a lattice form on a plane (e.g., a plane including a first direction X and a second direction Y) parallel with the upper surface of the substrate 100.

Each of the memory cells MC may have a tapered shape. For example, a width of each of the memory cells MC may decrease as each memory cell becomes far away from the lower insulating layer 105. In some embodiments, a width of each of the memory cells MC in the first direction X or the second direction Y may decrease with distance from the lower insulating layer 105, as illustrated in FIG. 4. A tilt angle formed by sides of the memory cells MC based on the upper surface of the substrate 100 may be, for example, about 60° to about 80°, but is not limited thereto. In some embodiments, the sides of the memory cells MC may be angled with respect to the upper surface of the substrate 100 by, for example, about 60° to about 80°.

Each of the memory cells MC may include a bottom electrode pattern BE, a magnetic tunnel junction element ME and a top electrode pattern TE.

The magnetic tunnel junction element ME may include a first magnetic pattern 130, a tunnel barrier pattern 140 and a second magnetic pattern 150. The first magnetic pattern 130 and the second magnetic pattern 150 may be spaced apart from each other, and the tunnel barrier pattern 140 may be interposed between the first magnetic pattern 130 and the second magnetic pattern 150. For example, the first magnetic pattern 130, the tunnel barrier pattern 140 and the second magnetic pattern 150 may be sequentially stacked on the lower insulating layer 105. The first magnetic pattern 130, the tunnel barrier pattern 140 and the second magnetic pattern 150 may be sequentially stacked on the lower insulating layer 105 in the third direction Z, as illustrated in FIG. 4.

One of the first magnetic pattern 130 and the second magnetic pattern 150 may be a reference layer having a fixed magnetization direction regardless of an external magnetic field, and the other one of the first magnetic pattern 130 and the second magnetic pattern 150 may be a free layer that is variable between two stable magnetization directions.

For example, as shown in FIGS. 5A and 5B, the first magnetic pattern 130 may be a reference layer having a fixed magnetization direction, and the second magnetic pattern 150 may be a free layer having a variable magnetization direction, but this is only example. Unlike the shown example, the first magnetic pattern 130 may be a free layer, and the second magnetic pattern 150 may be a reference layer.

In some embodiments, each of the first magnetic pattern 130 and the second magnetic pattern 150 may have perpendicular magnetic anisotropy (PMA). For example, each of the first magnetic pattern and the second magnetic pattern 150 may include at least one of an intrinsic perpendicular magnetic material or an extrinsic perpendicular magnetic material. In detail, as shown in FIG. 5A, each of the first magnetic pattern 130 and the second magnetic pattern 150 may have a magnetization easy axis in a vertical direction (i.e., a third direction Z). For example, in FIG. 5A, a unidirectional arrow of the first magnetic pattern 130 may indicate that the magnetization direction of the first magnetic pattern 130 is fixed in the vertical direction, and a bidirectional arrow of the second magnetic pattern 150 indicates that the magnetization direction of the second magnetic pattern 150 may be magnetized in parallel or antiparallel with respect to the magnetization direction of the first magnetic pattern 130.

The intrinsic perpendicular magnetic material may refer to a material having perpendicular magnetization characteristics even when there is no external factor. For example, the intrinsic perpendicular magnetic material may include at least one of i) a perpendicular magnetic material (for example, CoFeTb, CoFeGd and CoFeDy), ii) a perpendicular magnetic material having a structure of $L1_0$, iii) CoPt of a hexagonal close packed lattice structure, or iv) a perpendicular magnetic structure. The perpendicular magnetic material having a structure of $L1_0$ may include, for example, FePt having a structure of $L1_0$, FePd having a structure of $L1_0$, or CoPd having a structure of $L1_0$ or CoPt having a structure of $L1_0$. The perpendicular magnetic structure may include magnetic layers and non-magnetic layers, which are alternately and repeatedly stacked. For example, the perpendicular magnetic structure may include $(Co/Pt)_n$, $(CoFe/Pt)_n$, $(CoFe/Pd)_n$, $(Co/Pd)_n$, $(Co/Ni)_n$, $(CoNi/Pt)_n$, (CoCr/Pt), or $(CoCr/Pd)_n$, where n is the number of stacks.

The extrinsic perpendicular magnetic material may refer to a material that has intrinsic horizontal magnetization characteristics but has perpendicular magnetization characteristics due to an external factor. For example, the extrinsic perpendicular magnetic material may have perpendicular magnetic anisotropy (i.e., interfacial perpendicular magnetic anisotropy; i-PMA) induced by junction with the tunnel barrier pattern 140. The extrinsic perpendicular magnetic material may include, for example, CoFeB or CoFe, but is not limited thereto.

In some embodiments, each of the first magnetic pattern 130 and the second magnetic pattern 150 may have an in-plane magnetic anisotropy (IMA). In detail, as shown in FIG. 5B, each of the first magnetic pattern 130 and the second magnetic pattern 150 may have a magnetization easy axis in a horizontal direction (e.g., the first direction X or the second direction Y). For example, in FIG. 5B, the unidirectional arrow of the first magnetic pattern 130 may indicate that the magnetization direction of the first magnetic pattern 130 is fixed in the horizontal direction, and the bidirectional arrow of the second magnetic pattern 150 indicates that the magnetization direction of the second magnetic pattern 150 may be magnetized in parallel or antiparallel with respect to the magnetization direction of the first magnetic pattern 130.

Each of the first magnetic pattern 130 and the second magnetic pattern 150, which have horizontal magnetic anisotropy (IMA), may include a ferromagnetic material. In some embodiments, a magnetic pattern of the first magnetic pattern 130 and the second magnetic pattern 150, which forms a reference layer, may further include an anti-ferromagnetic material for fixing the magnetization direction of the ferromagnetic material.

In some embodiments, each of the first magnetic pattern 130 and the second magnetic pattern 150 may include a Co-based Heusler's alloy.

The tunnel barrier pattern 140 may be provided as an insulated tunnel barrier that generates quantum mechanical tunneling between the first magnetic pattern 130 and the second magnetic pattern 150. The tunnel barrier pattern 140 may include, for example, at least one of a magnesium (Mg) oxide, an aluminum (Al) oxide, a magnesium-zinc (Mg—Zn) oxide, a magnesium-boron (Mg—B) oxide, a silicon (Si) oxide, a tantalum (Ta)-oxide, a silicon nitride (SiN), an aluminum nitride (AlN) or their combination, but is not limited thereto. For example, the tunnel barrier pattern 140 may include a magnesium oxide (MgO) layer having a face-centered cubic (FCC) crystal structure or a sodium chloride (NaCl) crystal structure.

The magnetic tunnel junction element ME may store data in each of the memory cells MC by using a difference in electrical resistance according to the magnetization direction of the first magnetic pattern 130 and the magnetization direction of the second magnetic pattern 150. In some embodiments, the magnetic tunnel junction element ME may be provided as a variable resistance element that may be switched to two resistive states by an electrical signal (e.g., a program current) applied thereto. For example, when the magnetization direction of the first magnetic pattern 130 and the magnetization direction of the second magnetic pattern 150 are parallel, the magnetic tunnel junction element ME has a low resistance value, and may store the low resistance value as data '0'. On the contrary, when the magnetization direction of the first magnetic pattern 130 and the magnetization direction of the second magnetic pattern 150 are parallel, the magnetic tunnel junction element ME has a high resistance value, and may store the high resistance value as data '1'.

The bottom electrode pattern BE may be interposed between the contact plug 110 and the magnetic tunnel junction element ME. Each of the memory cells MC may be electrically connected to the contact plug 110 through the bottom electrode pattern BE. The bottom electrode pattern BE may include, for example, a conductive metal (e.g., titanium, tantalum, ruthenium, or tungsten) or a conductive metal nitride (e.g., titanium nitride or tantalum nitride), but is not limited thereto.

The top electrode pattern TE may be interposed between the magnetic tunnel junction element ME and the first conductive line 200 that will be described later. Each of the memory cells MC may be electrically connected to the first conductive line 200 through the top electrode pattern TE. The top electrode pattern TE may include, for example, a conductive metal (e.g., titanium, tantalum, ruthenium or tungsten) or a conductive metal nitride (e.g., titanium nitride or tantalum nitride), but is not limited thereto.

Each of the memory cells MC may be connected to the selection element SE. For example, a landing contact CP1 connecting one source/drain region of the selection element SE with the contact plug 110 by passing through the inter-layer insulating layer 102 may be formed. Each of the memory cells MC may be electrically connected to the selection element SE through the landing contact CP1 and the contact plug 110.

The re-deposition insertion layer 160 may be formed on the lower insulating layer 105 between the memory cells MC. For example, the re-deposition insertion layer 160 may be extended along an upper surface of the lower insulating layer 105 from a side of each of the memory cells MC. For example, the memory cells may include a first memory cell MC1 and a second memory cell MC2, which are arranged along the second direction Y. The re-deposition insertion layer 160 may be extended along the upper surface of the lower insulating layer 105 between the first memory cell MC1 and the second memory cell MC2. Although not shown in detail, the re-deposition insertion layer 160 may be formed on the upper surface of the lower insulating layer 105 between the memory cells MC arranged along the first direction X. In some embodiments, the re-deposition insertion layer 160 may contact the upper surface of the lower insulating layer 105 between the first memory cell MC1 and the second memory cell MC2, as illustrated in FIG. 4.

In some embodiments, the upper surface of the lower insulating layer 105 may include a concave recess 105*r*. The recess 105*r* may be formed between the memory cells MC. The re-deposition insertion layer 160 may be extended along the recess 105*r*. In some embodiments, the concave recess 105*r* may be a recess curved toward the substrate 100, as illustrated in FIG. 4.

As shown in FIGS. 6A and 6B, the re-deposition insertion layer 160 may include a re-deposition insulating layer 162, a mixed layer 164 and a re-deposition byproduct layer 166, which are sequentially stacked on the lower insulating layer 105.

The re-deposition insulating layer 162 may be extended along the upper surface of the lower insulating layer 105. In some embodiments, the re-deposition insulating layer 162 may be extended along at least a portion of the recess 105*r*. Although only the re-deposition insulating layer 162 is shown as being extended from a side of the bottom electrode pattern BE, this is only example. In some embodiments, the re-deposition insulating layer 162 may be extended from an upper portion of the recess 105*r*. In some other embodiments, the re-deposition insulating layer 162 may be extended from a side of the first magnetic pattern 130.

The re-deposition insulating layer 162 may include an insulating material, for example, at least one of silicon nitride, silicon oxynitride, silicon oxycarbide, silicon boron nitride, silicon carbonitride, silicon oxycarbonitride or their combination, but is not limited thereto. For example, the re-deposition insulating layer 162 may include a silicon nitride layer.

In some embodiments, a thickness T1 (also referred to as a first thickness T1) of the re-deposition insulating layer 162 may increase as the re-deposition insulating layer 163 becomes far away from the respective memory cells MC. For example, the thickness T1 of the re-deposition insulating layer 162 may increase and then decrease in a direction from the first memory cell MC1 toward the second memory cell MC2. In some embodiments, the thickness T1 of the re-deposition insulating layer 162 may increase with distance from both the first memory cell MC1 and the second memory cell MC2, and the thickness T1 of the re-deposition insulating layer 162 may be thickest around a middle between the first memory cell MC1 and the second memory cell MC2, as illustrated in FIGS. 4 and 6A.

The mixed layer 164 and the re-deposition byproduct layer 166 may be sequentially stacked on the re-deposition insulating layer 162. That is, the mixed layer 164 may be interposed between the re-deposition insulating layer 162 and the re-deposition byproduct layer 166.

The re-deposition byproduct layer 166 may include conductive byproducts generated in an etching process for forming the memory cells MC (e.g., byproducts generated from the top electrode pattern TE). For example, the re-deposition byproduct layer 166 may include, but is not limited to, a conductive metal (e.g., titanium, tantalum, ruthenium or tungsten) or a conductive metal nitride (e.g., titanium nitride or tantalum nitride).

The mixed layer 164 may include both a material included in the re-deposition insulating layer 162 and a material included in the re-deposition byproduct layer 166 and may include a mixture of the material included in the re-deposition insulating layer 162 and the material included in the re-deposition byproduct layer 166. For example, when the re-deposition insulating layer 162 includes silicon nitride and the re-deposition byproduct layer 166 includes a conductive metal material (e.g., titanium, tantalum, ruthenium, or tungsten), the mixed layer 164 may include a mixture of the silicon nitride and the conductive metal material.

In some embodiments, a thickness T2 (also referred to as a second thickness T2) of the mixed layer 164 may increase as the mixed layer 164 becomes far away from the respective memory cells MC. For example, the thickness T2 of the mixed layer 164 may increase and then decrease in a direction from the first memory cell MC1 toward the second memory cell MC2. In some embodiments, the thickness T2 of the mixed layer 164 may increase with distance from both the first memory cell MC1 and the second memory cell MC2, and thus the thickness T2 of the mixed layer 164 may be thickest around a middle between the first memory cell MC1 and the second memory cell MC2, as illustrated in FIGS. 4 and 6A In FIGS. 6A and 6B, the thickness T2 of the mixed layer 164 is shown as being smaller than the thickness T1 of the re-deposition insulating layer 162, but this is only example. In some other embodiments, the thickness T2 of the mixed layer 164 may be greater than or equal to the thickness T1 of the re-deposition insulating layer 162.

In some embodiments, as shown in FIG. 6A, a bottom byproduct layer RD_b2 may be interposed between the lower insulating layer 105 and the re-deposition insertion layer 160. For example, the bottom byproduct layer RD_b2 may be extended along at least a portion of the recess 105*r*, and the re-deposition insulating layer 162 may be stacked on the bottom byproduct layer RD_b2. The bottom byproduct layer RD_b2 may include conductive byproducts generated in an etching process for forming the memory cells MC (e.g., conductive byproducts generated from the top electrode pattern TE). For example, the bottom byproduct layer RD_b2 may include a conductive metal (e.g., titanium, tantalum, ruthenium or tungsten) or a conductive metal nitride (e.g., titanium nitride or tantalum nitride), but is not limited thereto.

In some other embodiments, as shown in FIG. 6B, the bottom byproduct layer RD_b2 may not be interposed between the lower insulating layer 105 and the re-deposition insertion layer 160.

The capping passivation layer 170 may be formed on the memory cells MC and the re-deposition insertion layer 160. For example, the capping passivation layer 170 may be conformally extended along a profile of the side of each of the memory cells MC and an upper surface of the re-deposition insertion layer 160. The capping passivation layer 170 may expose (e.g., may not cover or overlap) an upper surface of each of the memory cells MC (e.g., an upper surface of the top electrode pattern TE).

The capping passivation layer 170 may be provided as a protective layer for protecting the memory cells MC from moisture or oxidation. For example, the capping passivation layer 170 may reduce or prevent degradation of characteristics (e.g., retention, coercive force He, resistance-area product RA, tunneling magnetoresistance ratio (TMR), etc.) of the magnetic tunnel junction element ME due to moisture or oxidation. The capping passivation layer 170 may include, for example, a silicon nitride layer, but is not limited thereto.

The filling insulating layer 190 may be formed on the capping passivation layer 170. The filling insulating layer 190 may fill a space (for example, a space between the first memory cell MC1 and the second memory cell MC2) between the memory cells MC. The filling insulating layer 190 may include, for example, silicon oxide or silicon oxynitride, but is not limited thereto.

The first conductive line 200 may be formed on the memory cells MC, the capping passivation layer 170 and the filling insulating layer 190. The first conductive line 200 may be electrically connected to the top electrode pattern TE. The first conductive line 200 may be provided as a bit line (e.g., the bit line BL of FIG. 2). For example, the plurality of first conductive lines 200 may be extended in parallel in the second direction Y. In some embodiments, a single first conductive line 200 extended in the second direction Y may be electrically connected to the plurality of memory cells (e.g., the first memory cell MC1 and the second memory cell MC2) arranged along the second direction Y.

The second conductive line 210 may be formed on the substrate 100. For example, the second conductive line 210 may be formed on the interlayer insulating layer 102. The second conductive line 210 may be electrically connected to the selection element SE. For example, a source contact CP2 connecting the other source/drain region of the selection element SE to the second conductive line 210 by passing through the interlayer insulating layer 102 may be formed. The second conductive line 210 may be provided as a source line connected to the selection element SE.

Hereinafter, a method for fabricating a magnetic memory device according to example embodiments will be described with reference to FIGS. 1 and 7 to 24.

FIGS. 7 to 20 are cross-sectional views illustrating a method for fabricating a magnetic memory device according to some embodiments. For convenience of description, redundant portions of those described with reference to FIGS. 1 to 6B will be briefly described or omitted.

Figure 7:
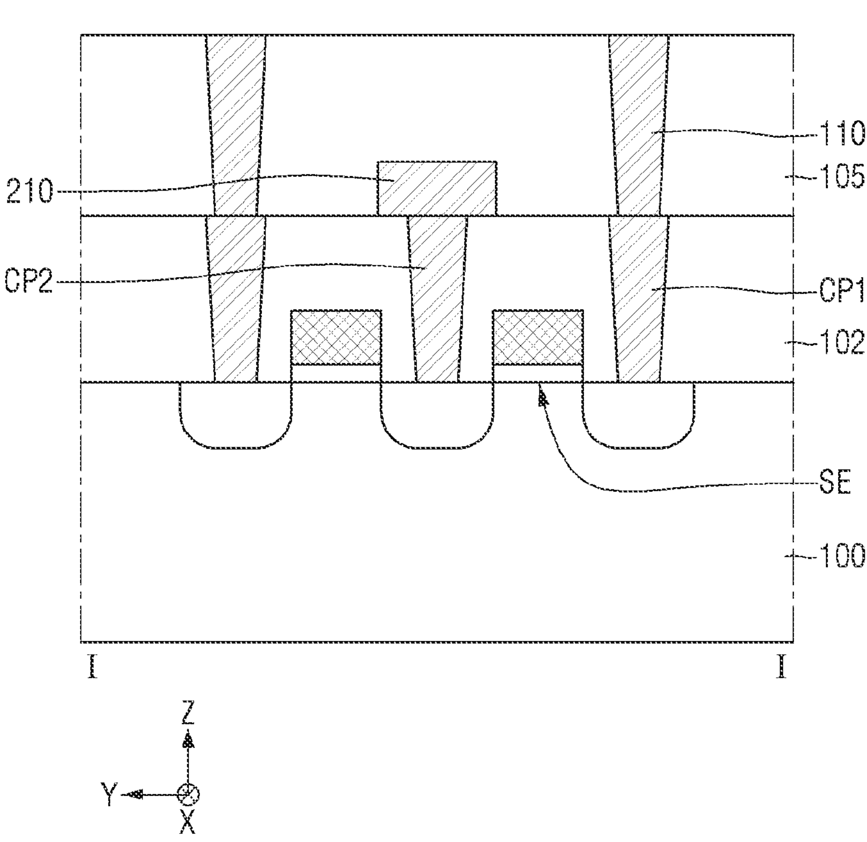
FIGS. 7 to 20 are cross-sectional views illustrating a method for fabricating a magnetic memory device according to some embodiments.

Referring to FIG. 7, a lower insulating layer 105 and a contact plug 110 are formed on a substrate 100.

For example, a selection element SE may be formed on the substrate 100. Subsequently, an interlayer insulating layer 102 covering the selection element SE may be formed. A landing contact CP1 and a source contact CP2, which are connected to the selection element SE, may be formed through the interlayer insulating layer 102. A second conductive line 210 connected to the source contact CP2 may be formed on the interlayer insulating layer 102. A lower insulating layer 105 may be formed on the interlayer insulating layer 102 to cover a second conductive line 210. The contact plug 110 may be connected to the landing contact CP1 by passing through the lower insulating layer 105.

Figure 8:
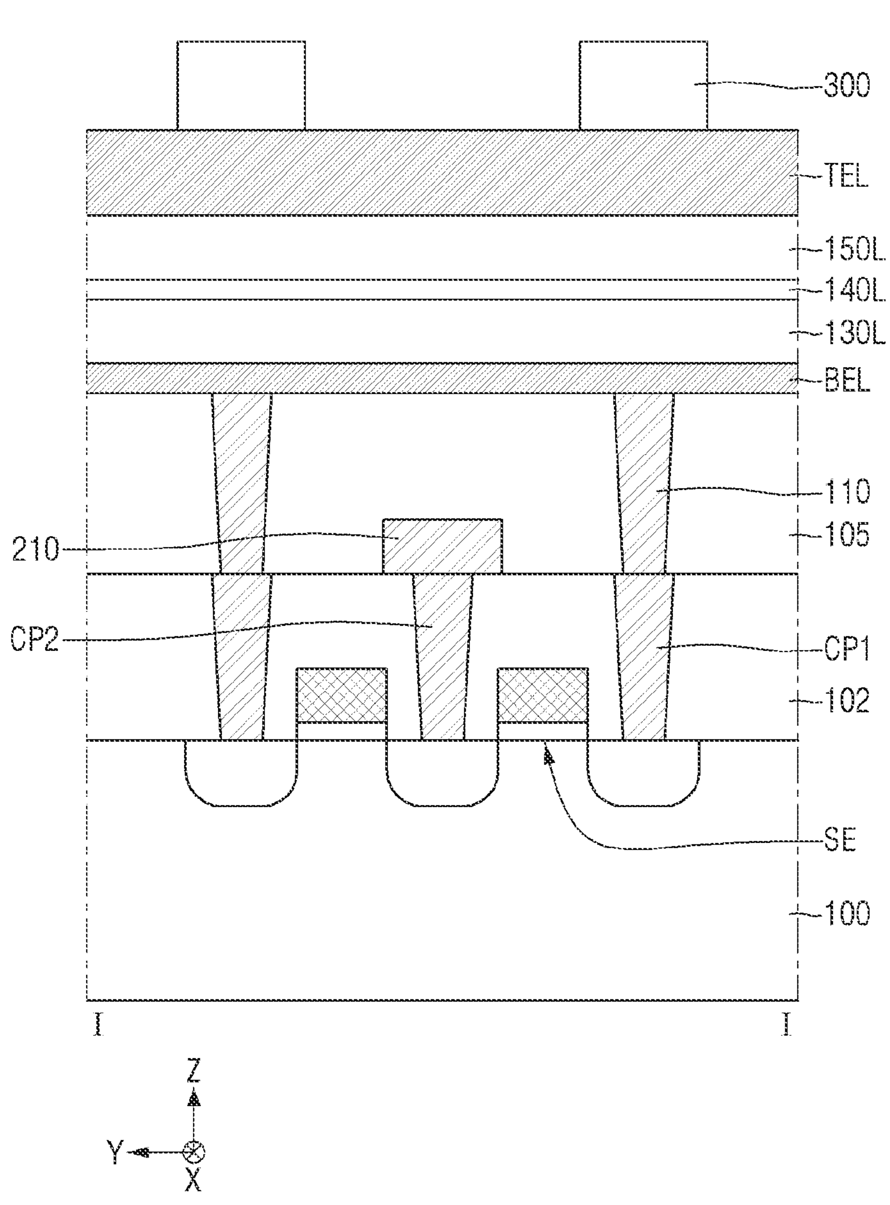

Referring to FIG. 8, a bottom electrode layer BEL, a first magnetic layer 130L, a tunnel barrier layer 140L, a second magnetic layer 150L, a top electrode layer TEL and a mask pattern 300 are formed on the lower insulating layer 105 and the contact plug 110.

The bottom electrode layer BEL may cover the lower insulating layer 105 and the contact plug 110. The bottom electrode layer BEL may be electrically connected to the contact plug 110. The bottom electrode layer BEL may include, for example, a conductive metal (e.g., titanium, tantalum, ruthenium or tungsten) or a conductive metal nitride (e.g., titanium nitride or tantalum nitride), but is not limited thereto.

The first magnetic layer 130L, the tunnel barrier layer 140L and the second magnetic layer 150L may be sequentially stacked on the bottom electrode layer BEL. One of the first magnetic layer 130L and the second magnetic layer 150L may be a reference layer having a fixed magnetization direction regardless of an external magnetic field, and the other one of the first magnetic layer 130L and the second magnetic layer 150L may be a free layer that is variable between two stable magnetization directions. The tunnel barrier layer 140L may be provided as an insulated tunnel barrier that generates quantum mechanical tunneling between the first magnetic layer 130L and the second magnetic layer 150L.

The top electrode layer TEL may be stacked on the second magnetic layer 150L. The top electrode layer TEL may include, for example, a conductive metal (e.g., titanium, tantalum, ruthenium or tungsten) or a conductive metal nitride (e.g., titanium nitride or tantalum nitride), but is not limited thereto.

The mask pattern 300 may be formed on the top electrode layer TEL. The mask pattern 300 may be formed to correspond to a position in which the contact plug 110 is disposed. The mask pattern 300 may be a photoresist pattern or a hard mask pattern.

Figure 9:
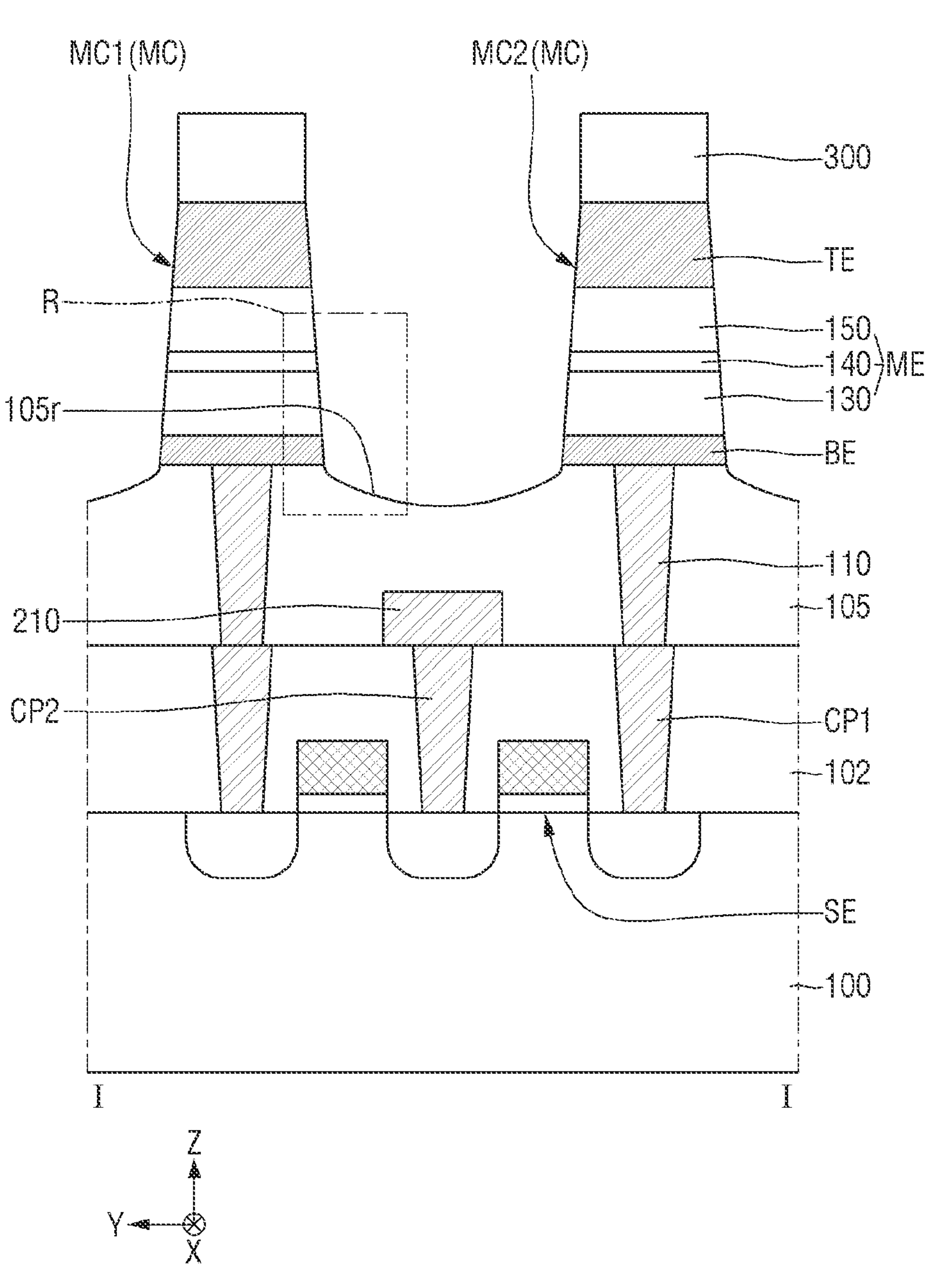
Figure 10:
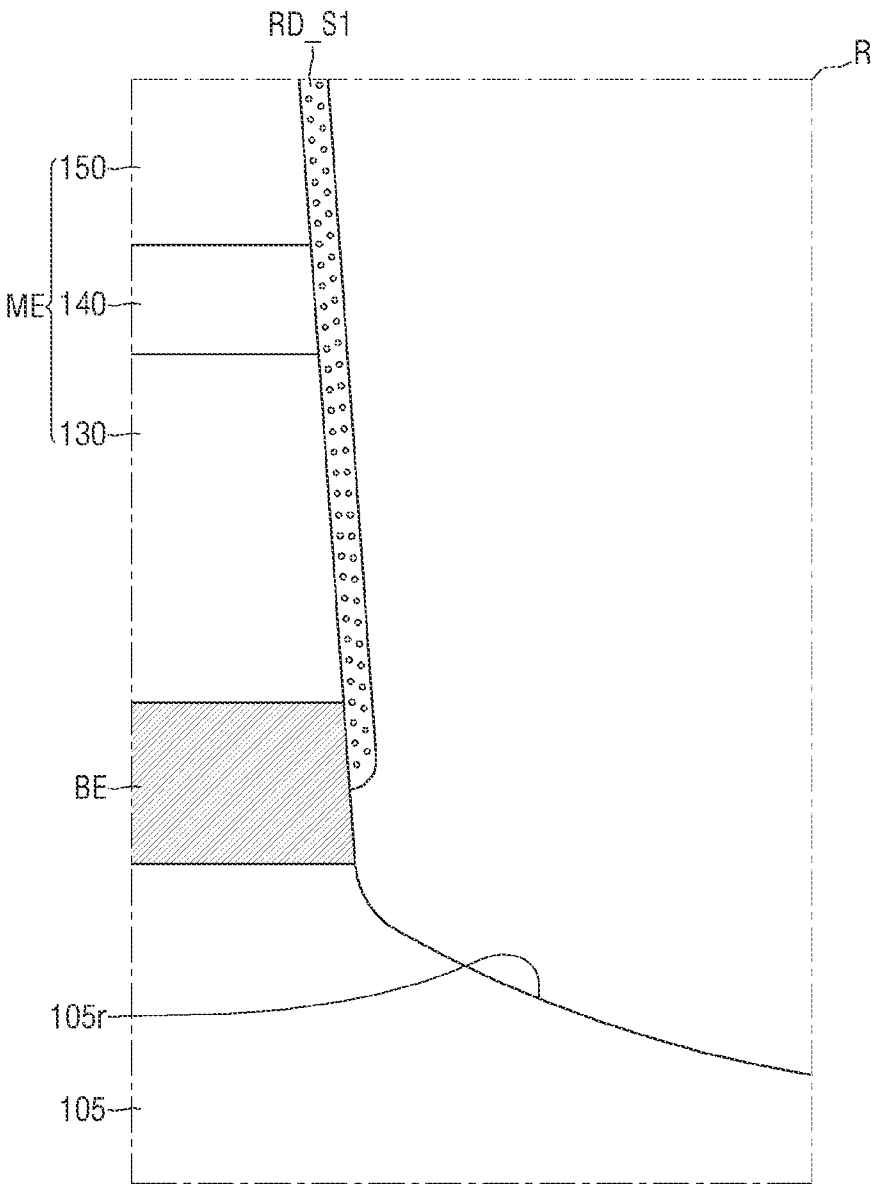

Referring to FIGS. 9 and 10, a plurality of memory cells MC may be formed. For reference, FIG. 10 is an enlarged view illustrating a region R of FIG. 9.

For example, an etching process using the mask pattern 300 as an etch mask may be performed. As the etching process is performed, the bottom electrode layer BEL, the first magnetic layer 130L, the tunnel barrier layer 140L, the second magnetic layer 150L and the top electrode layer TEL of FIG. 8 may be patterned. Therefore, a plurality of memory cells MC, each of which includes a bottom electrode pattern BE, a magnetic tunnel junction element ME and a top electrode pattern TE, may be formed. The etching process may include, for example, an ion beam etching process, but is not limited thereto. After the memory cells MC are formed, the mask pattern 300 may be removed.

While the etching process is being performed, conductive byproducts may be generated and re-deposited on the memory cells MC. For example, as shown in FIG. 10, a first conductive byproduct layer RD_S1 may be formed on a side of the magnetic tunnel junction element ME. The first conductive byproduct layer RD_S1 may include conductive byproducts generated in the etching process (e.g., byproducts generated from the top electrode layer TEL). For example, the first conductive byproduct layer RD_S1 may include a conductive metal (e.g., titanium, tantalum, ruthenium or tungsten) or a conductive metal nitride (e.g., titanium nitride or tantalum nitride), but is not limited thereto.

Figure 11:
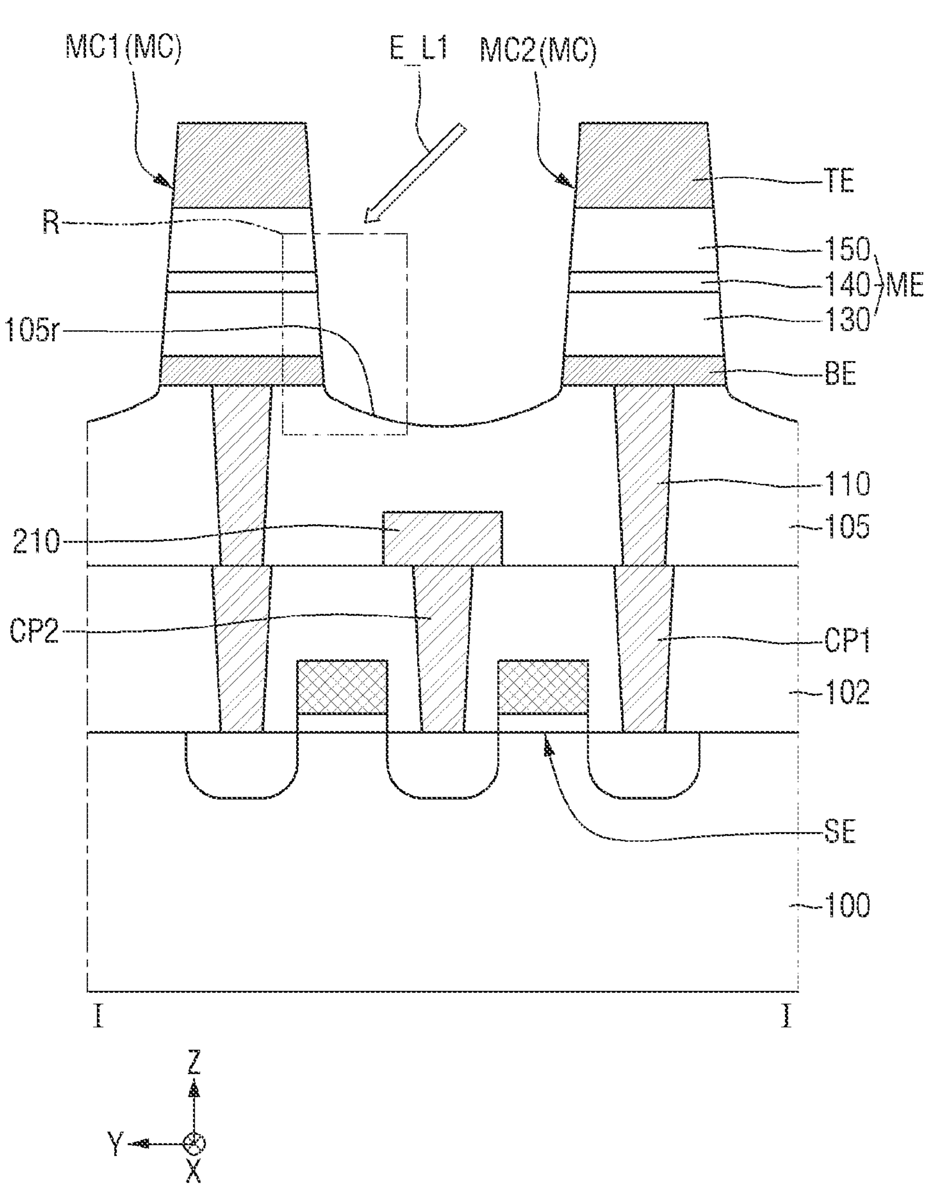
Figure 12:
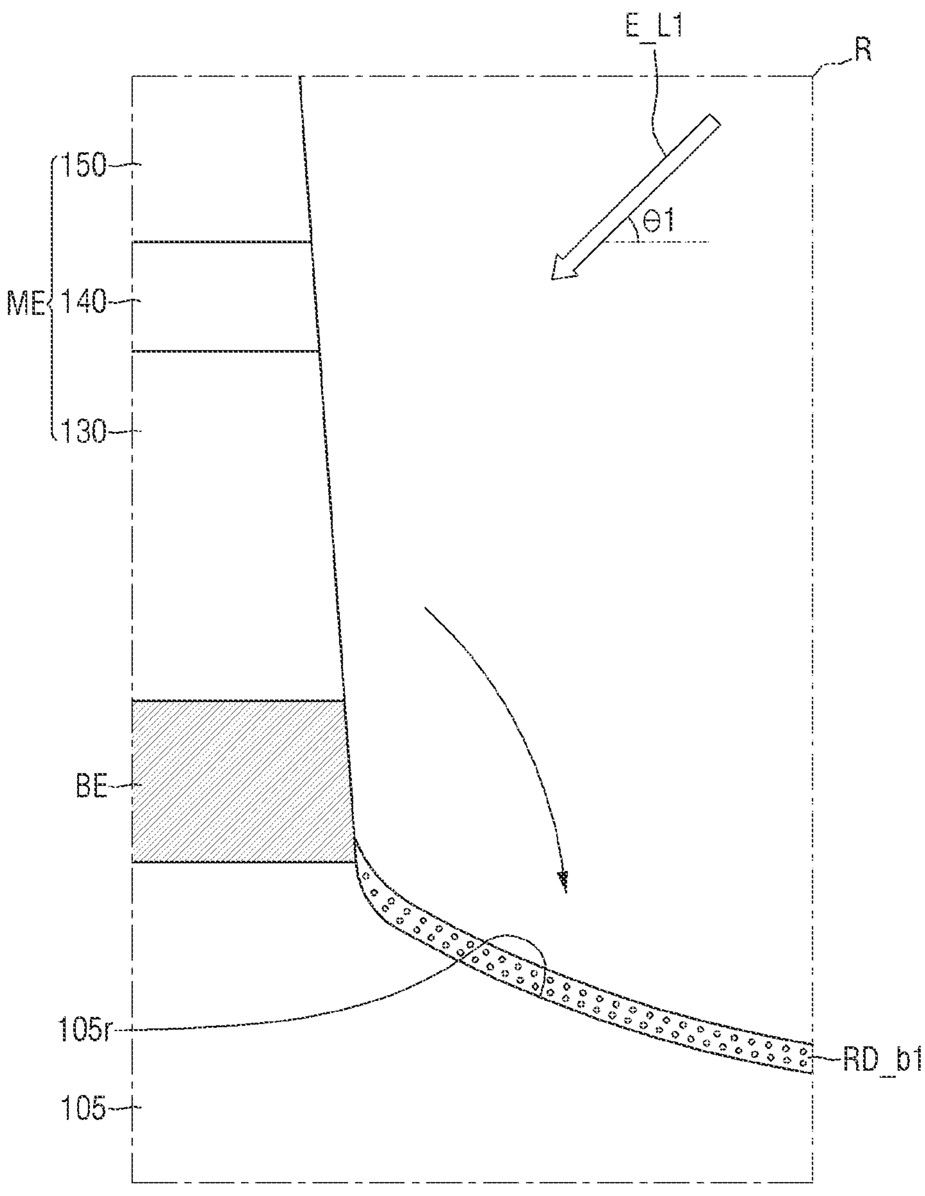

Referring to FIGS. 11 and 12, a first trimming process E_L1 is performed. For reference, FIG. 12 is an enlarged view illustrating a region R of FIG. 11.

The first trimming process E_L1 may be performed to remove the conductive byproducts that are re-deposited on sides of the memory cells MC. For example, as shown in FIG. 12, as the first trimming process E_L1 is performed, at least a portion of the first conductive byproduct layer RD_S1 may be removed. For example, the first trimming process E_L1 may include a first ion beam etching process performed at a low angle. A first tilt angle θ1 of the first ion beam etching process may be relatively a low angle of, for example, about 25° to about 50°.

While the first trimming process E_L1 is being performed, conductive byproducts may be generated from at least a portion of the first conductive byproduct layer RD_S1 and then re-deposited on an upper surface of the lower insulating layer 105. For example, as shown in FIG. 12, a second conductive byproduct layer RD_b1 may be formed on a recess 105*r* of the lower insulating layer 105. The second conductive byproduct layer RD_b1 may include conductive byproducts generated in the first trimming process E_L1. For example, the second conductive byproduct layer RD_b1 may include a conductive metal (e.g., titanium, tantalum, ruthenium or tungsten) or a conductive metal nitride (e.g., titanium nitride or tantalum nitride), but is not limited thereto.

Figure 13:
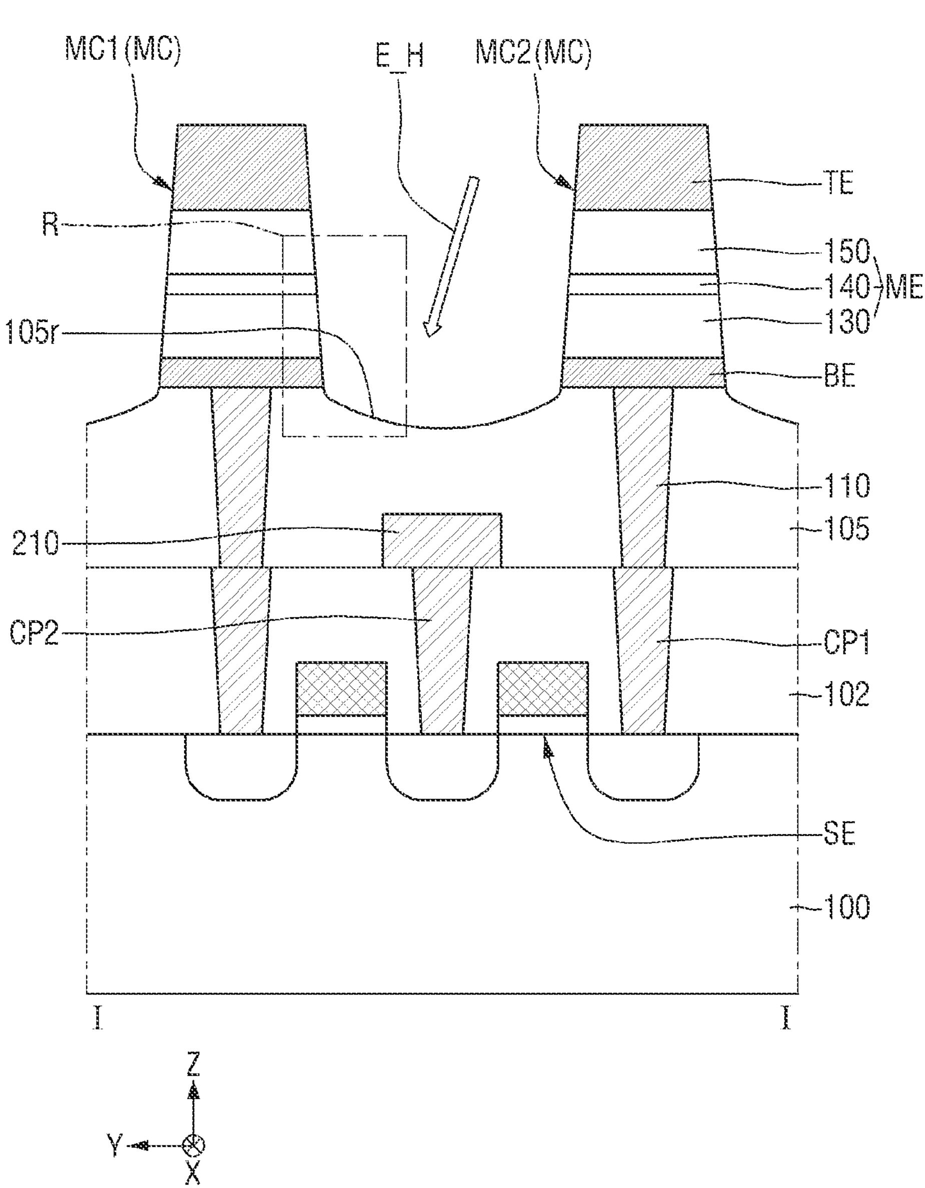
Figure 14:
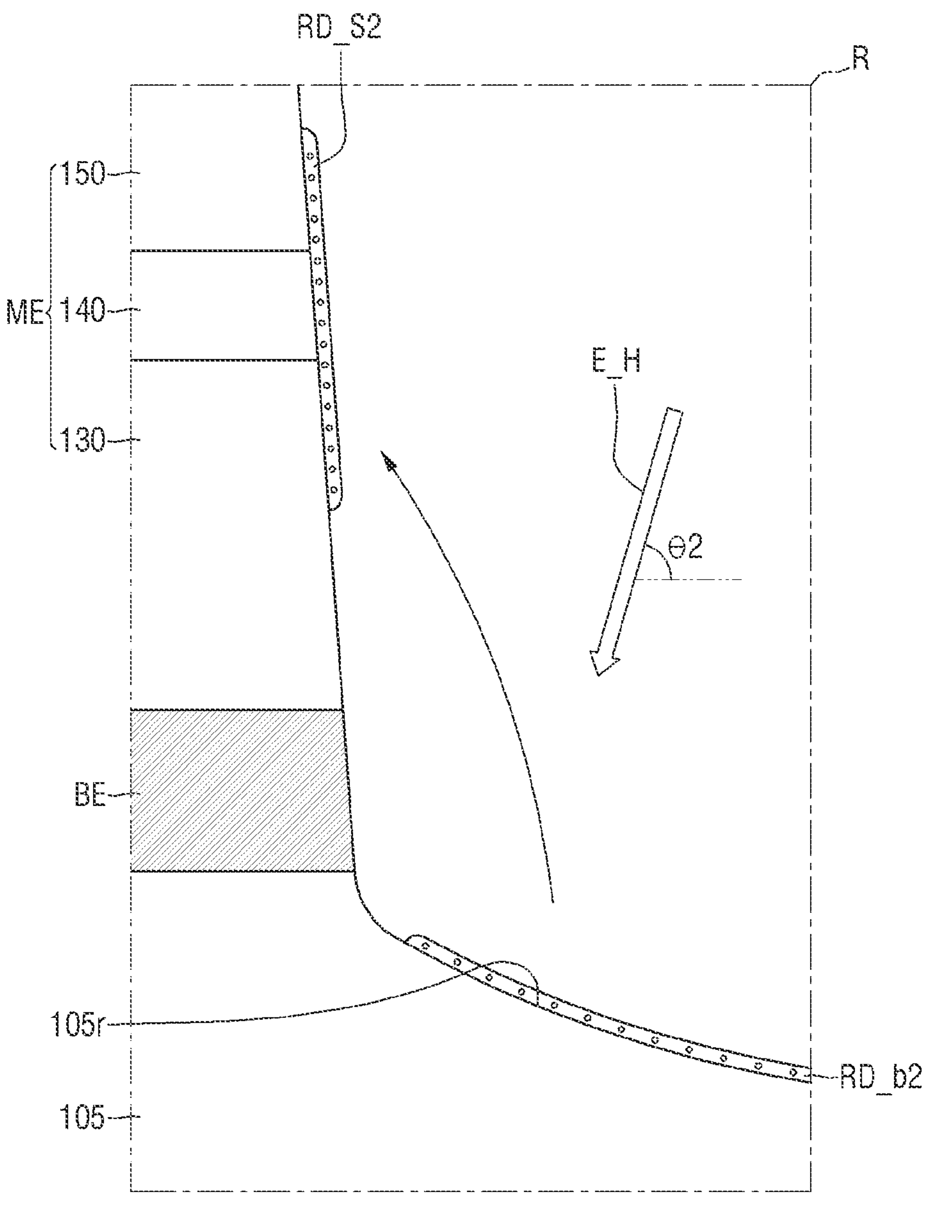

Referring to FIGS. 13 and 14, a second trimming process E_H is performed. For reference, FIG. 14 is an enlarged view illustrating a region R of FIG. 13.

The second trimming process E_H may be performed to remove the conductive byproducts that are re-deposited on the upper surface of the lower insulating layer 105. For example, as shown in FIG. 14, as the second trimming process E_H is performed, at least a portion of the second conductive byproduct layer RD_b1 may be removed. For example, the second trimming process E_H may include a second ion beam etching process performed at a high angle. A second tilt angle θ2 of the second ion beam etching process may be greater than the first tilt angle θ1 of the first ion beam etching process, and may be relatively a high angle of, for example, about 50° to about 70°.

While the second trimming process E_H is being performed, conductive byproducts may be generated from at least a portion of the second conductive byproduct layer RD_b1 and then re-deposited on the sides of the memory cells MC. For example, as shown in FIG. 14, a third conductive byproduct layer RD_S2 may be formed on a side of the magnetic tunnel junction element ME. As the first trimming process E_L1 and the second trimming process E_H are performed, a size of the third conductive byproduct layer RD_S2 re-deposited on the sides of the memory cells MC may decrease as compared with the first conductive byproduct layer RD_S1.

In some embodiments, after the second trimming process E_H is performed, a portion of the second conductive byproduct layer RD_b1 may remain on the upper surface of the lower insulating layer 105. For example, as shown in FIG. 14, a bottom byproduct layer RD_b2 may remain on the recess 105*r* of the lower insulating layer 105.

Figure 15:
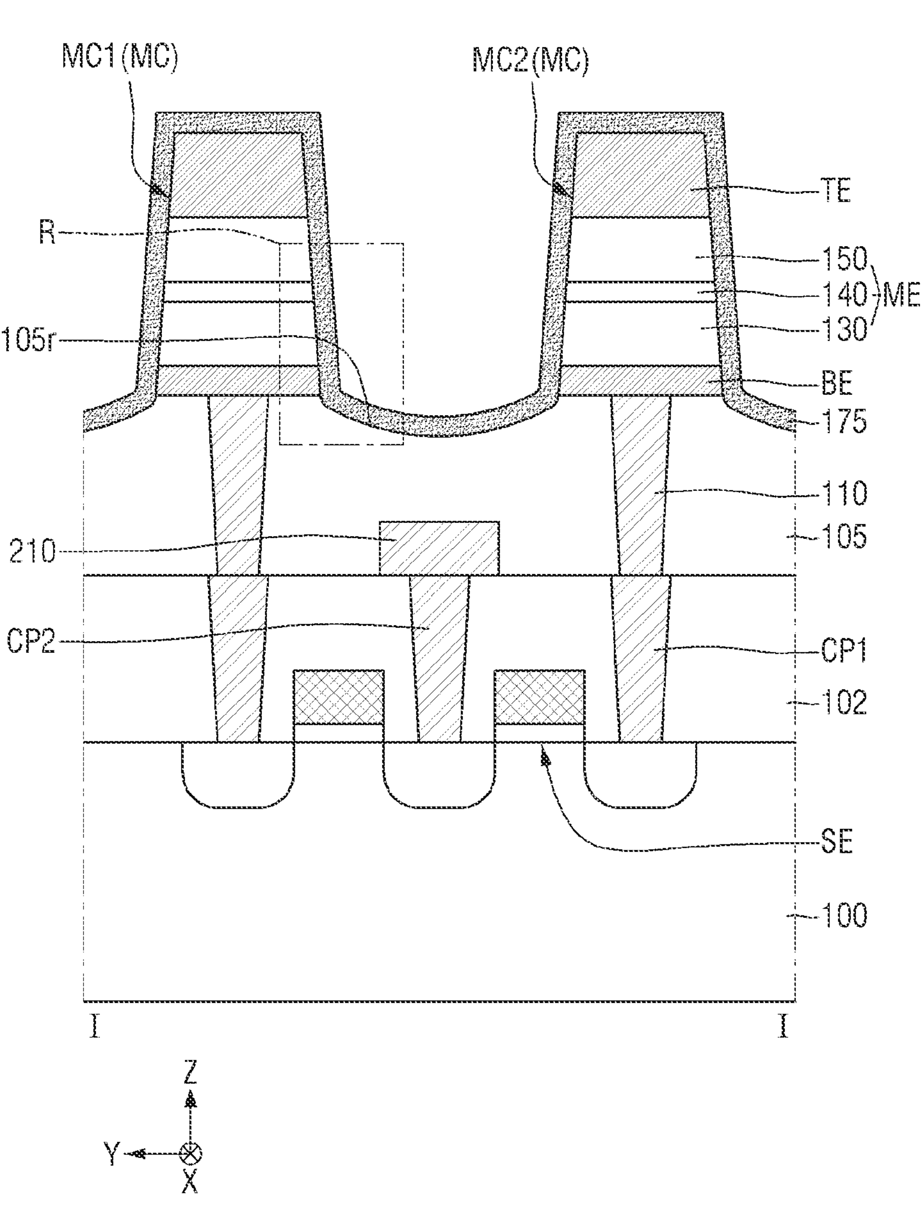
Figure 16:
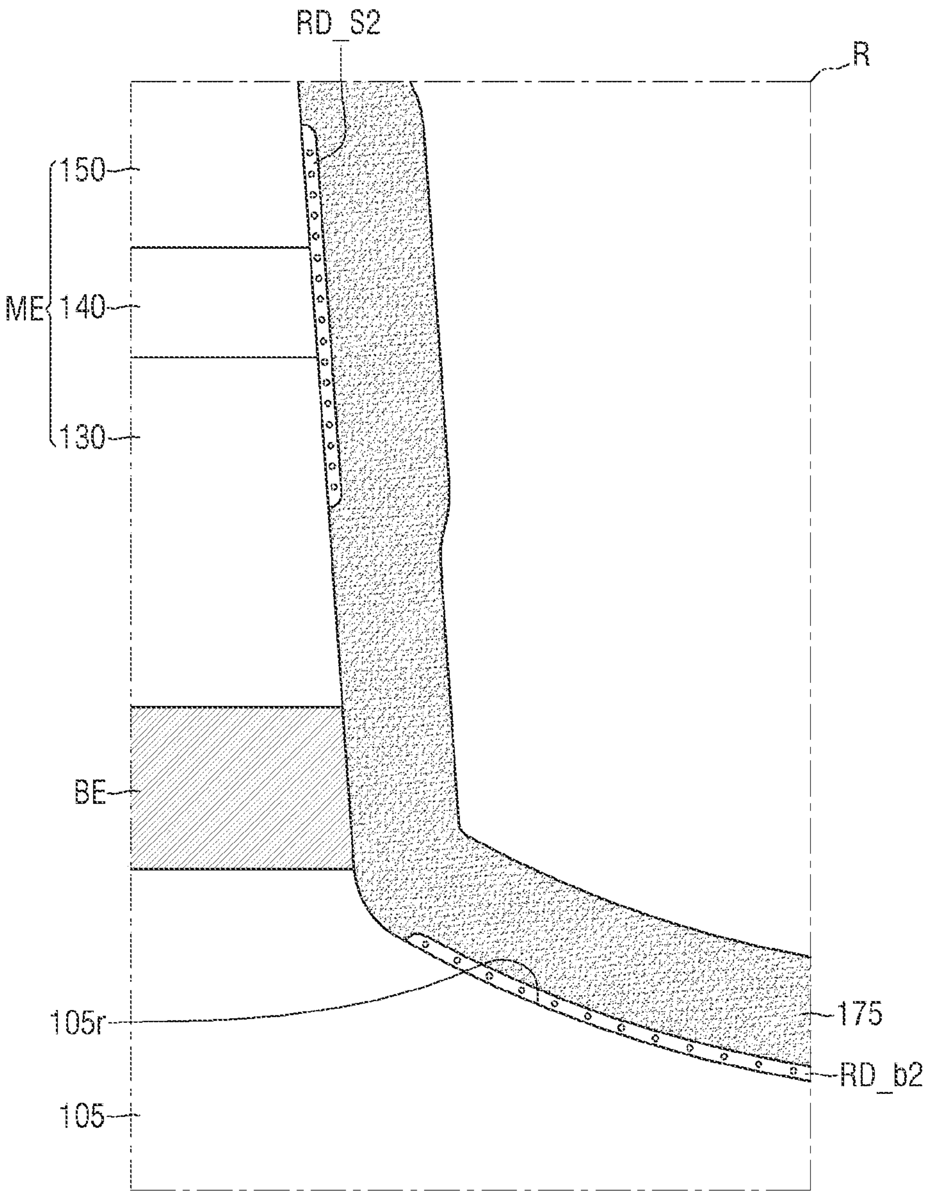

Referring to FIGS. 15 and 16, a capping insulating layer 175 is formed. For reference, FIG. 16 is an enlarged view illustrating a region R of FIG. 15.

The capping insulating layer 175 may be formed on the lower insulating layer 105 and the memory cells MC. The capping insulating layer 175 may be conformally extended along a profile of each of the memory cells MC and the lower insulating layer 105. As shown in FIG. 16, the capping insulating layer 175 may cover conductive byproducts (e.g., the third conductive byproduct layer RD_S2 and the bottom byproduct layer RD_b2) re-deposited on the lower insulating layer 105 and the memory cells MC. In some embodiments, the capping insulating layer 175 may have a uniform thickness along the profile of each of the memory cells MC and the lower insulating layer 105, as illustrated in FIG. 15.

The capping insulating layer 175 may include an insulating material, for example, at least one of silicon nitride, silicon oxynitride, silicon oxycarbide, silicon boron nitride, silicon carbonitride, silicon oxycarbonitride or their combination, but is not limited thereto. For example, the capping insulating layer 175 may include a silicon nitride layer.

Figure 17:
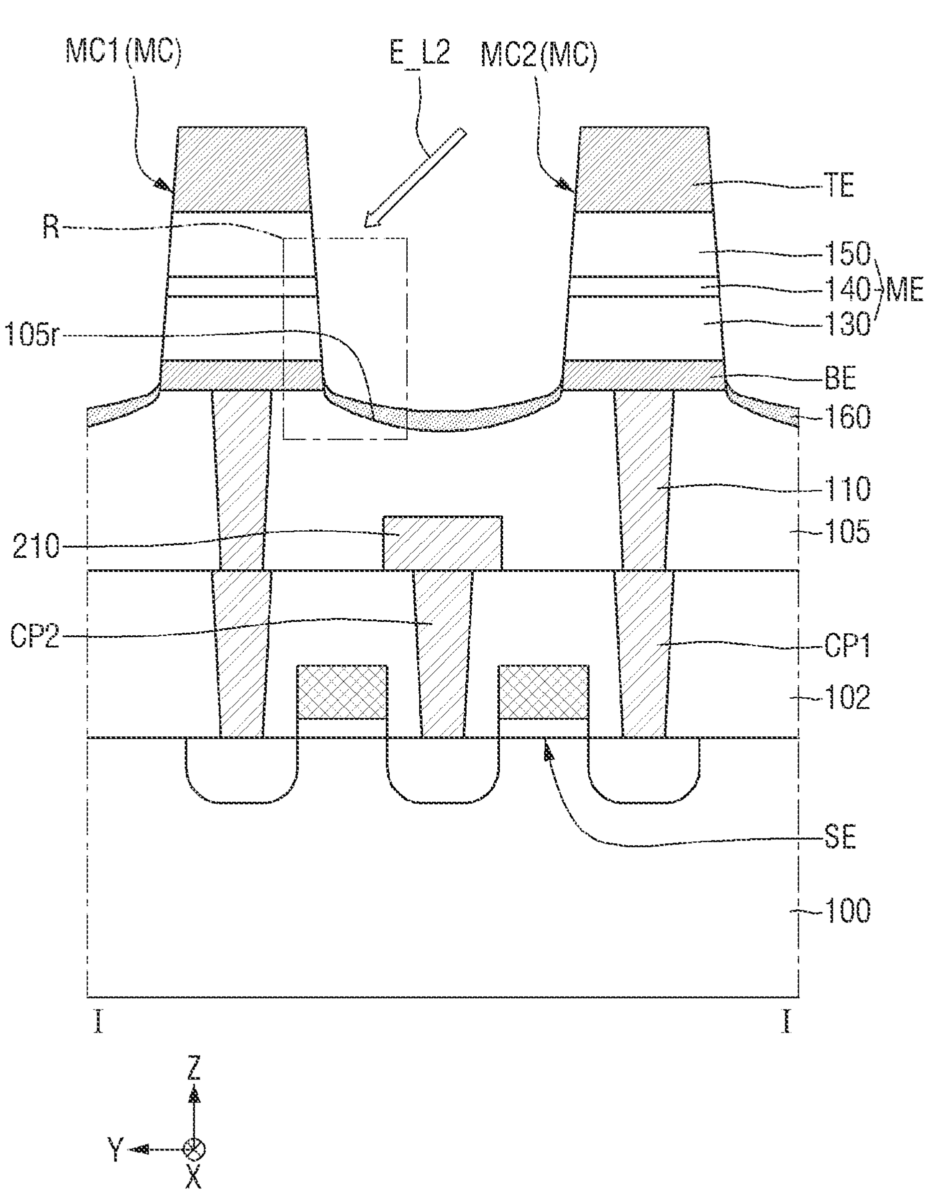
Figure 18:
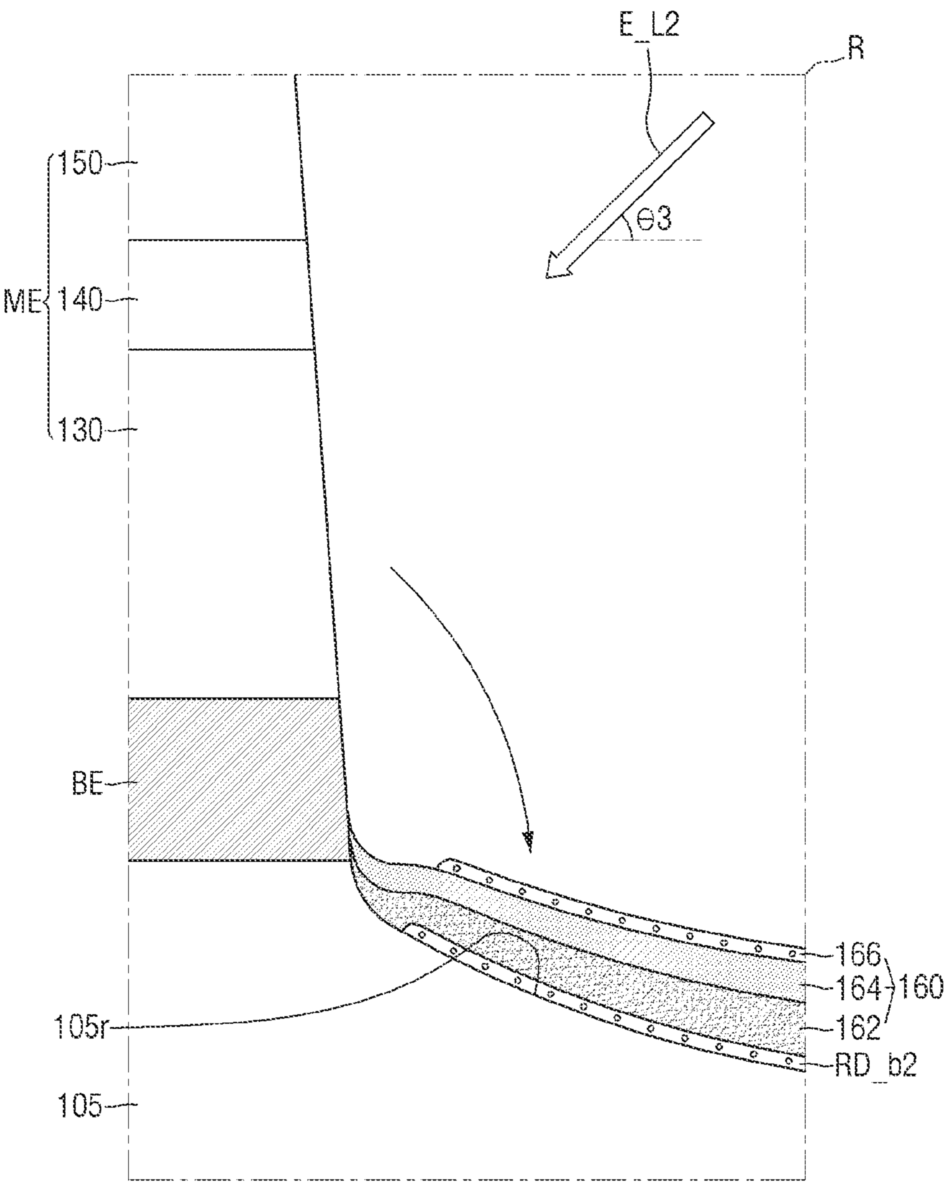

Referring to FIGS. 17 and 18, a third trimming process E_L2 is performed.

The third trimming process E_L2 may be performed for the sides of the memory cells MC. For example, the third trimming process E_L2 may include a third ion beam etching process performed at a low angle. A third tilt angle θ3 of the third ion beam etching process may be smaller than the second tilt angle θ2 of the second ion beam etching process, and may be relatively a low angle of, for example, about 25° to about 50°.

As the third trimming process E_L2 is performed, a re-deposition insertion layer 160 may be formed on the lower insulating layer 105 between the memory cells MC.

In detail, as the third trimming process E_L2 is performed, at least a portion of the capping insulating layer 175 deposited on the side of each of the memory cells MC may be re-deposited on the upper surface of the lower insulating layer 105. A re-deposition insulating layer 162 including a material (e.g., silicon nitride) included in the capping insulating layer 175 may be formed on the lower insulating layer 105.

Then, as the third trimming process E_L2 is continuously performed to gradually remove the capping insulating layer 175 on the side of each of the memory cells MC, at least a portion of the conductive byproducts (e.g., the third conductive byproduct layer RD_S2) on the side of each of the memory cells MC may be gradually re-deposited on the upper surface of the lower insulating layer 105. Therefore, a mixed layer 164, which includes a mixture of a material (e.g., silicon nitride) included in the capping insulating layer 175 and a material (e.g., a conductive metal material) included in the third conductive byproduct layer RD_S2, may be formed on the re-deposition insulating layer 162.

As the third trimming process E_L2 is continuously performed, at least a portion of conductive byproducts (e.g., the third conductive byproduct layer RD_S2) on the side of each of the memory cells MC may be re-deposited on the upper surface of the lower insulating layer 105. Therefore, a re-deposition byproduct layer 166, which includes conductive byproducts generated in the third trimming process E_L2, may be re-deposited on the mixed layer 164.

Figure 19:
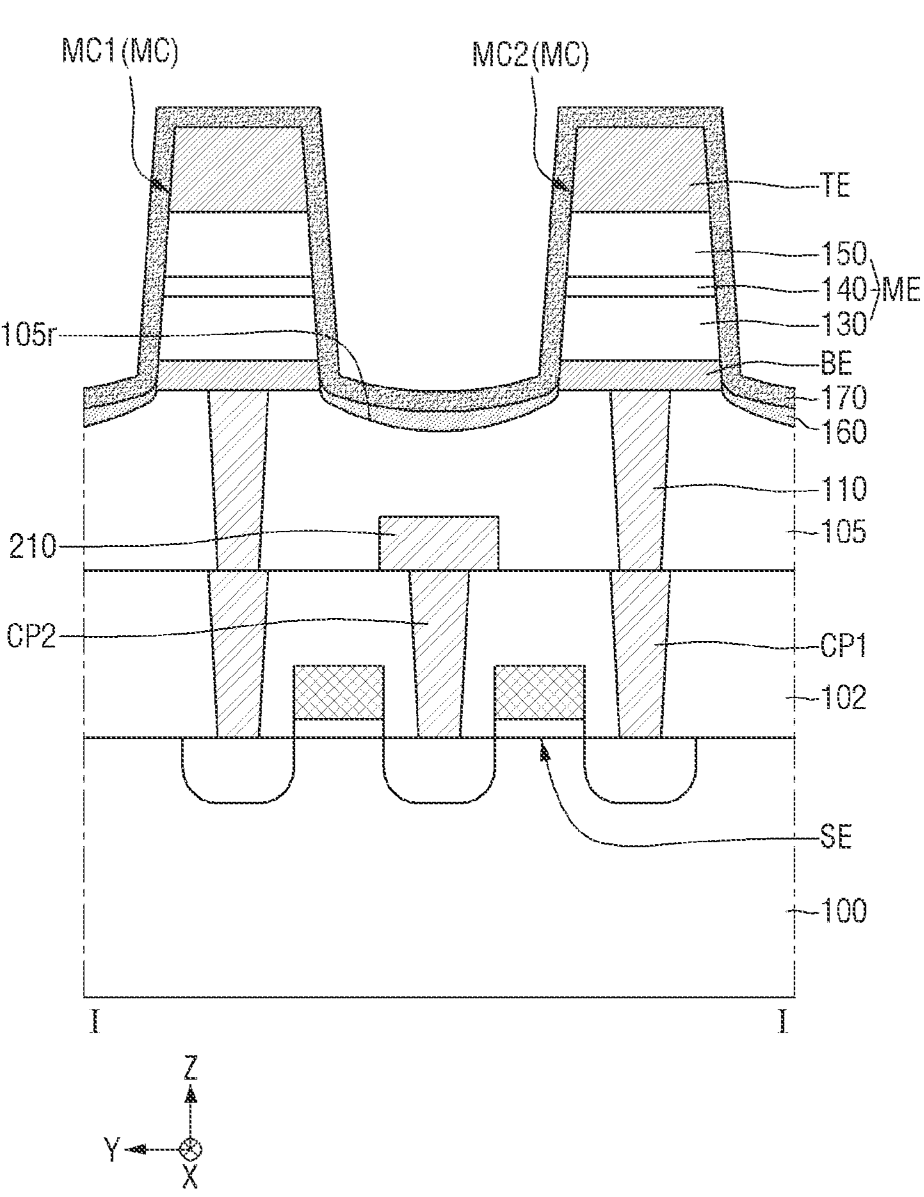

Referring to FIG. 19, a capping passivation layer 170 is formed on the memory cells MC and the re-deposition insertion layer 160.

The capping passivation layer 170 may cover the memory cells MC and the re-deposition insertion layer 160. For example, the capping passivation layer 170 may be conformally extended along a profile of each of the memory cells MC and the re-deposition insertion layer 160.

The capping passivation layer 170 may be provided as a protective layer for protecting the memory cells MC from moisture or oxidation. For example, the capping passivation layer 170 may reduce or prevent degradation of characteristics (e.g., retention, coercive force Hc, resistance-area product RA, tunneling magnetoresistance ratio (TMR), etc.) of the magnetic tunnel junction element ME due to moisture or oxidation. The capping passivation layer 170 may include, for example, a silicon nitride layer, but is not limited thereto.

Figure 20:
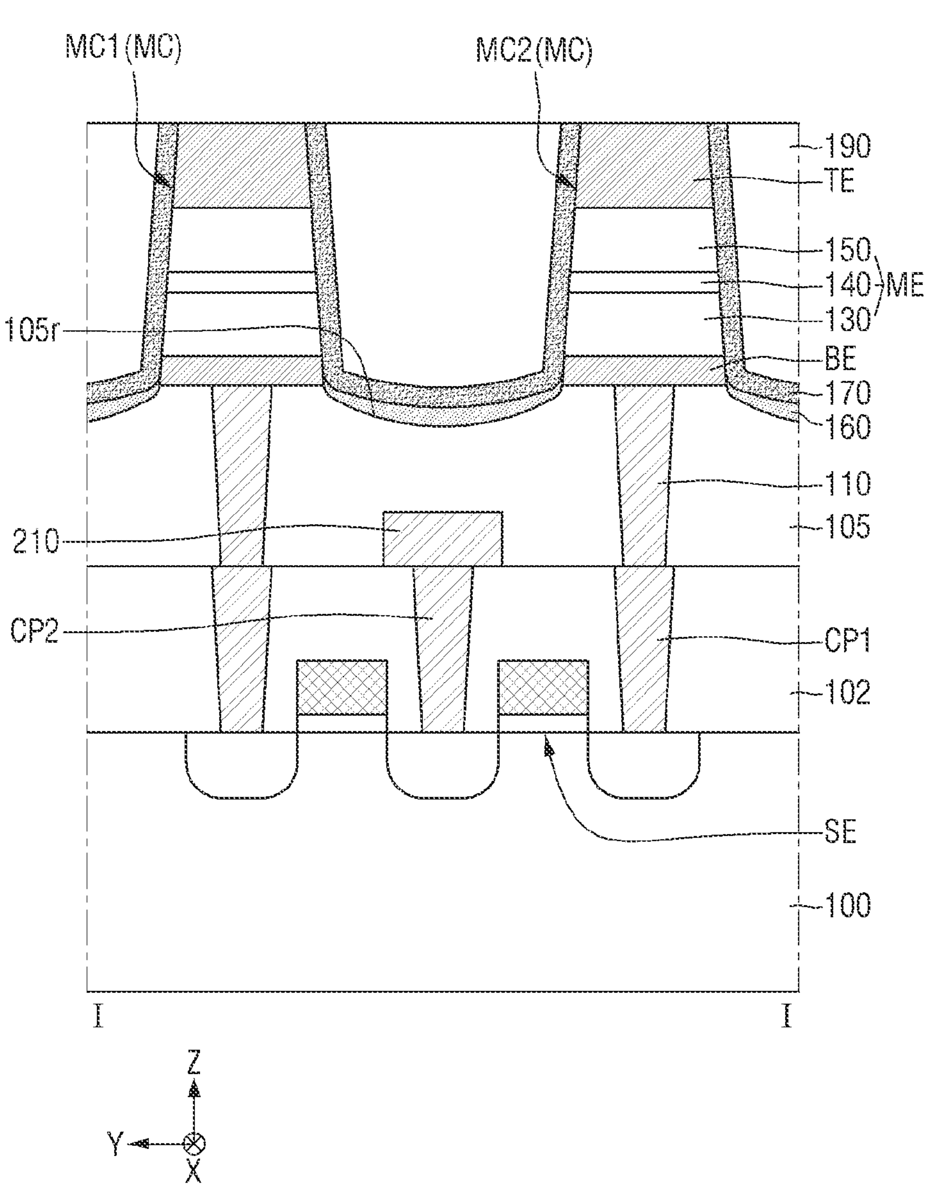

Referring to FIG. 20, a filling insulating layer 190 is formed on the capping passivation layer 170.

The filling insulating layer 190 may fill a space (for example, a space between the first memory cell MC1 and the second memory cell MC2) between the memory cells MC. The filling insulating layer 190 may include, for example, silicon oxide or silicon oxynitride, but is not limited thereto.

The capping passivation layer 170 and the filling insulating layer 190 may expose an upper surface (e.g., an upper surface of the top electrode pattern TE) of each of the memory cells MC. For example, after the filling insulating layer 190 is formed on the capping passivation layer 170, a planarization process for the capping passivation layer 170 and the filling insulating layer 190 may be performed. The planarization process may include, for example, a chemical mechanical polishing process.

Subsequently, referring back to FIG. 4, a first conductive line 200 is formed on the memory cells MC, the capping passivation layer 170 and the filling insulating layer 190. Therefore, the above-described magnetic memory device may be fabricated using FIGS. 4 and 6A.

Figure 21:
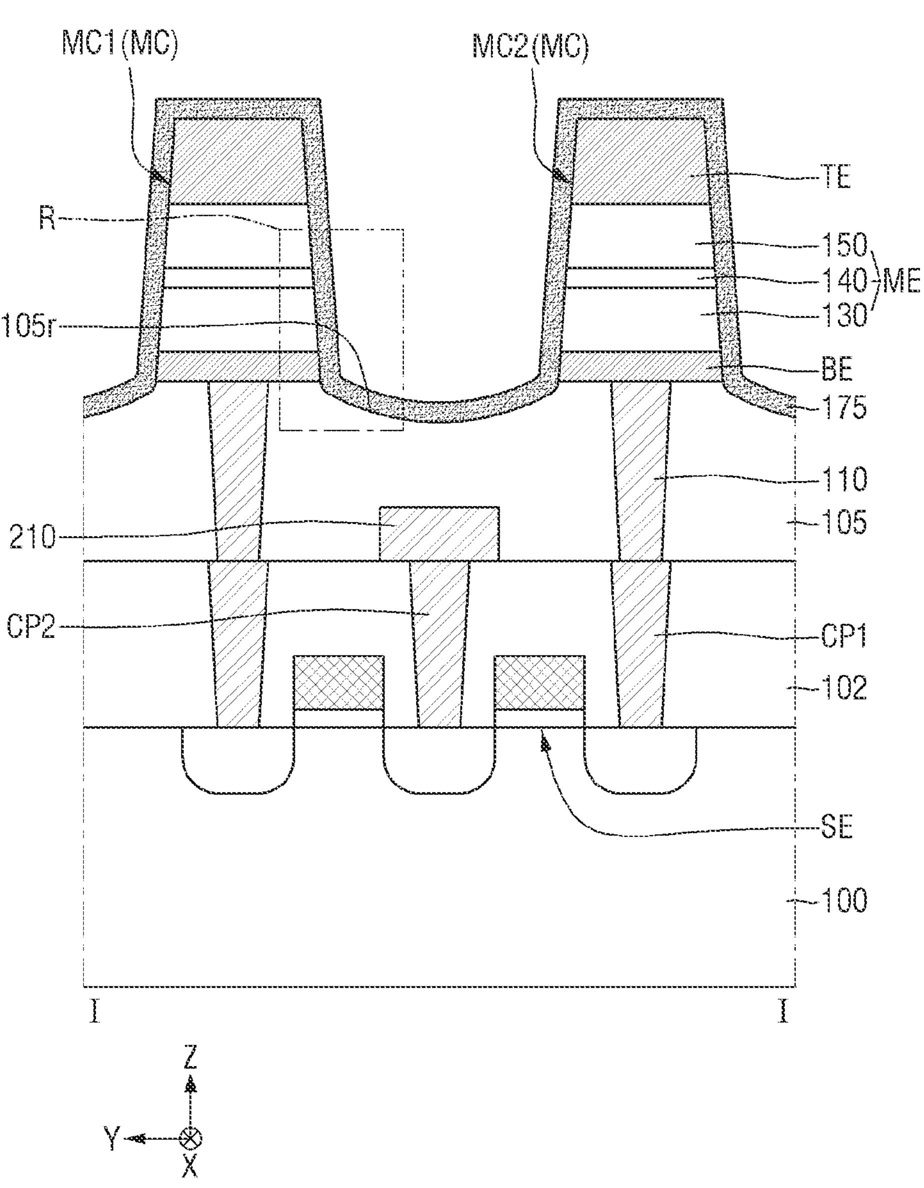
FIGS. 21 to 24 are cross-sectional views illustrating a method for fabricating a magnetic memory device according to some embodiments.

FIGS. 21 to 24 are cross-sectional views illustrating a method for fabricating a magnetic memory device according to some embodiments. For convenience of description, redundant portions of those described with reference to FIGS. 1 to 20 will be briefly described or omitted. For reference, FIG. 21 is a cross-sectional view illustrating process(es) performed after FIG. 9.

Figure 22:
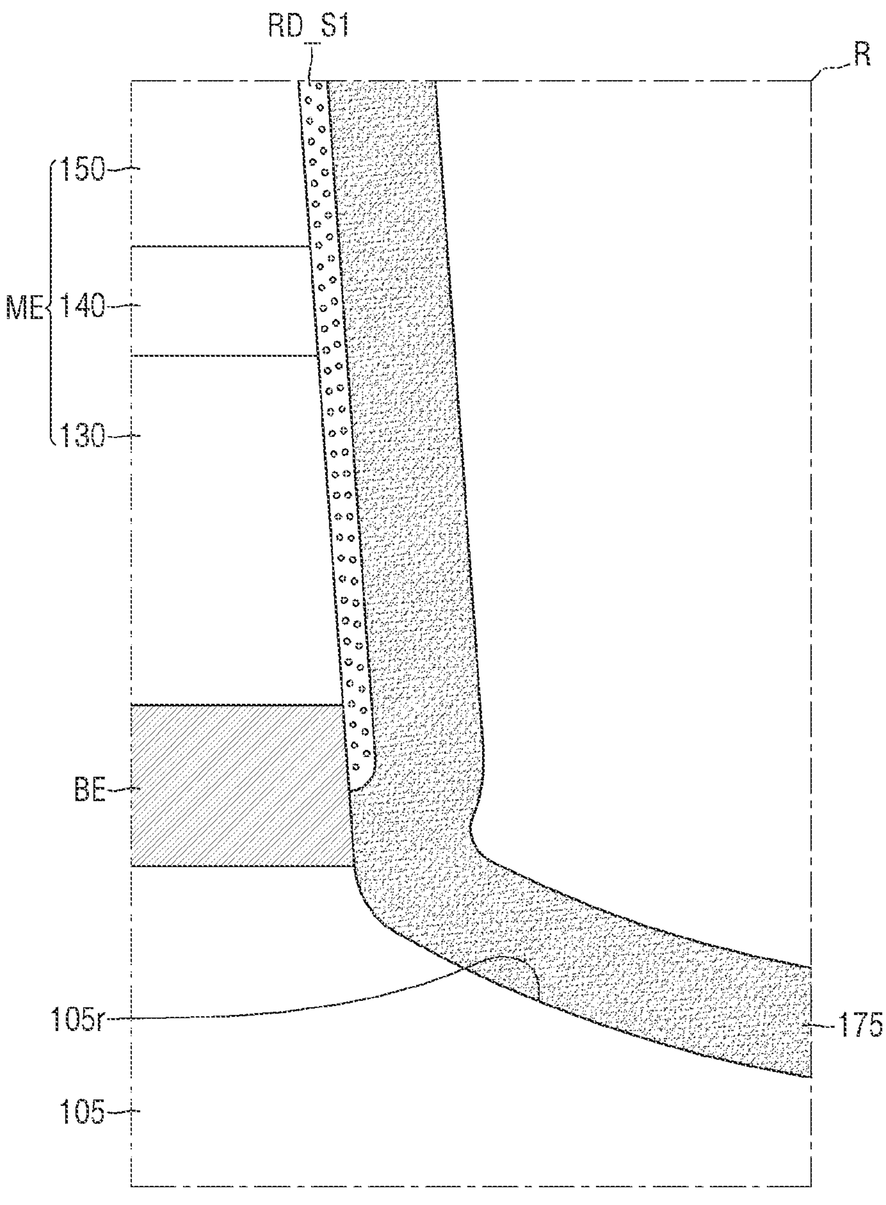

Referring to FIGS. 21 and 22, a capping insulating layer 175 is formed. For reference, FIG. 22 is an enlarged view illustrating a region R of FIG. 21.

The capping insulating layer 175 may be formed on the lower insulating layer 105 and the memory cells MC. As shown in FIG. 22, the capping insulating layer 175 may cover conductive byproducts (e.g., the first conductive byproduct layer RD_S1) that are re-deposited on the memory cells MC. The formation of the capping insulating layer 175 is similar to that described above with reference to FIGS. 15 and 16 and thus its detailed description will be omitted.

Figure 23:
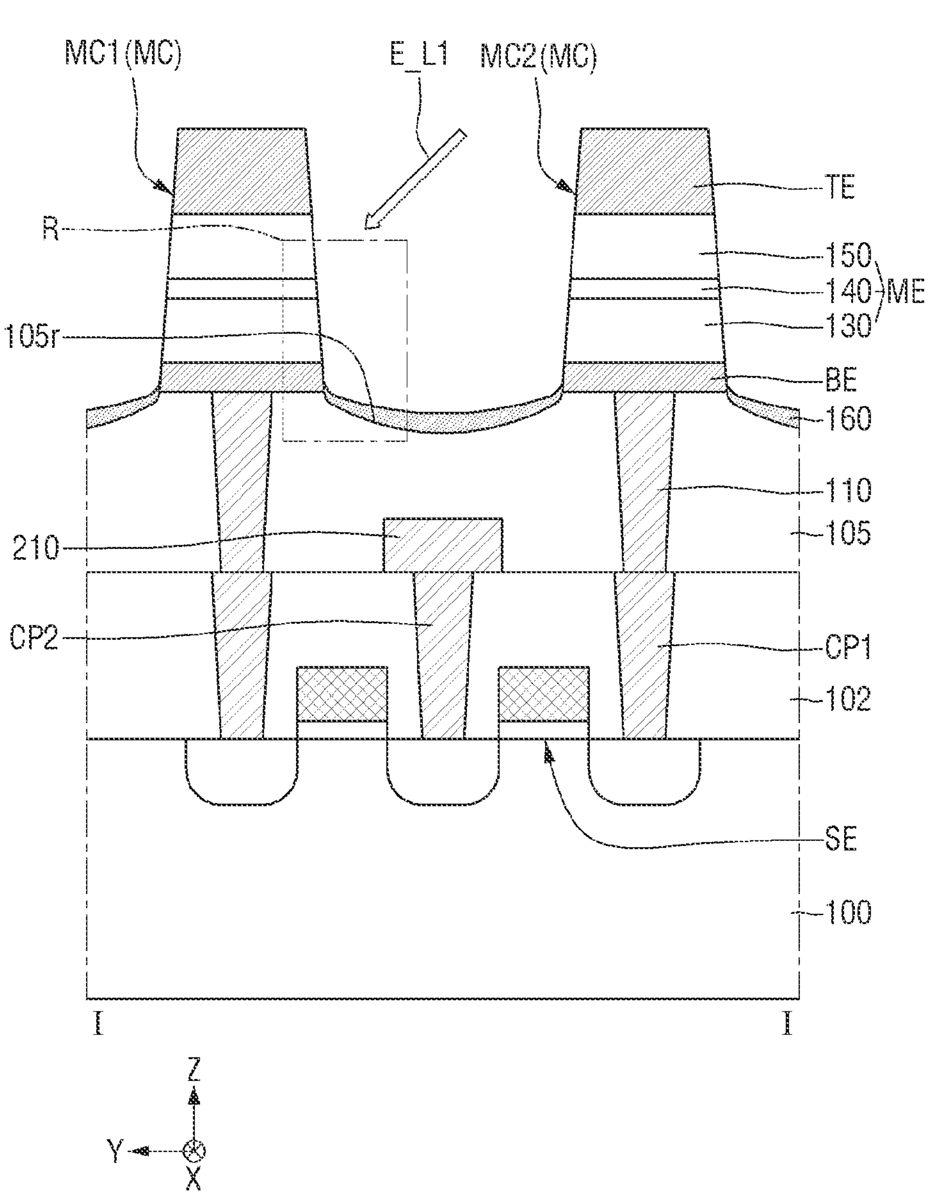
Figure 24:
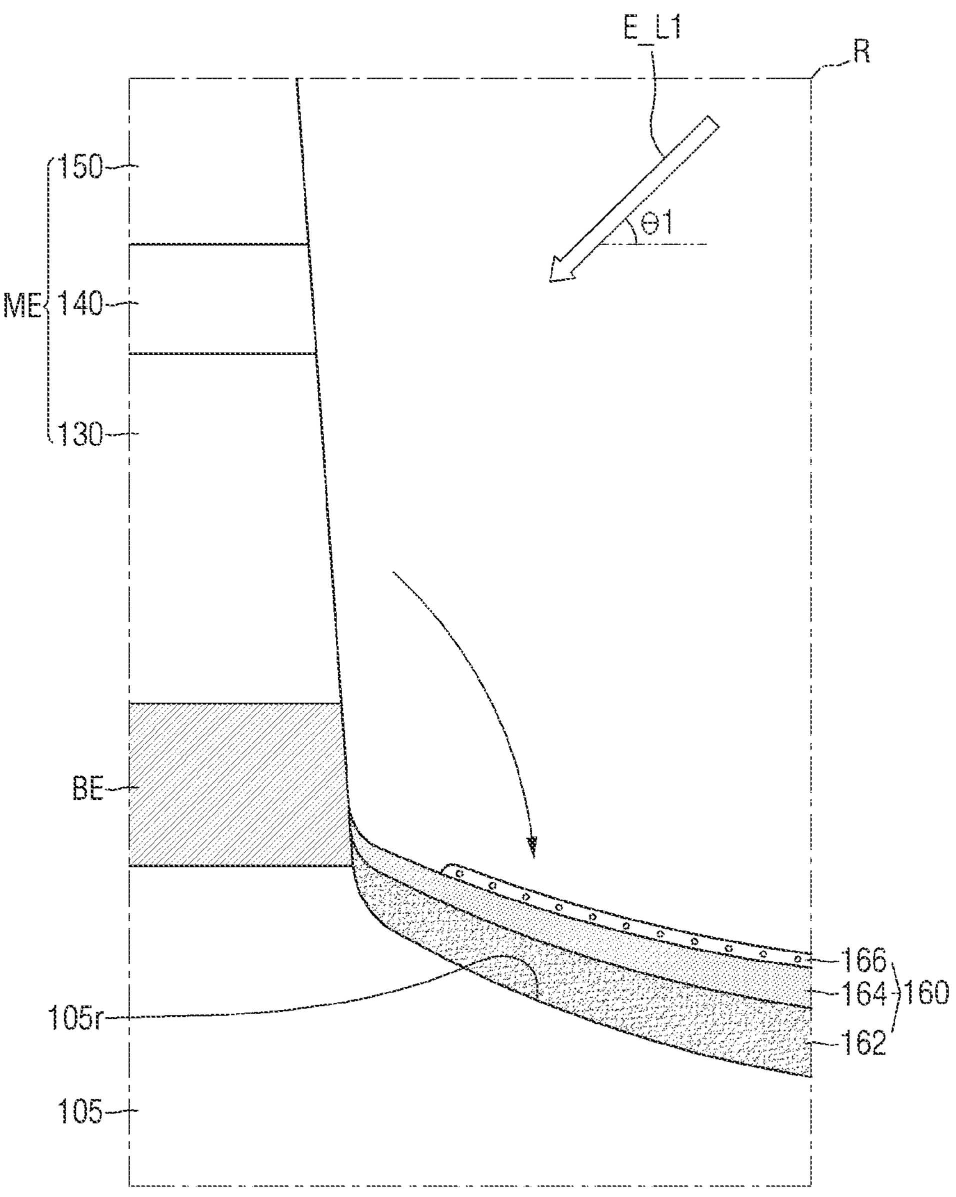

Referring to FIGS. 23 and 24, the first trimming process E_L1 is performed. For reference, FIG. 24 is an enlarged view illustrating a region R of FIG. 23.

The first trimming process E_L1 may be performed for the side of the memory cells MC. For example, the first trimming process E_L1 may include a first ion beam etching process performed at a low angle. A first tilt angle θ1 of the first ion beam etching process may be relatively a low angle of, for example, about 25° to about 50°.

As the first trimming process E_L1 is performed, a re-deposition insertion layer 160 may be formed on the lower insulating layer 105 between the memory cells MC. The formation of the re-deposition insertion layer 160 is similar to that described above with reference to FIGS. 17 and 18 and thus their detailed description will be omitted.

Subsequently, the steps/processes described with reference to FIGS. 19, 20 and 4 may be performed. Therefore, the magnetic memory device described using FIGS. 4 and 6B may be fabricated.

As described above, in a patterning process (or etching process) for forming the memory cells MC, the conductive byproducts (e.g., the first conductive byproduct layer RD_S1 of FIG. 10 or the third conductive byproduct layer RD_S2 of FIG. 14) that are re-deposited on the sides of the memory cells MC may be generated. The conductive byproducts may cause an electrical short between magnetic patterns (e.g., the first magnetic pattern 130 and the second magnetic pattern 150) constituting the magnetic tunnel junction element ME.

In order to solve this problem, a trimming process (e.g., the first trimming process E_L1 of FIGS. 11 and 12) for the sides of the memory cells MC may be performed. However, as the magnetic memory device is increasingly highly integrated, problems occur in that an interval between the memory cells MC becomes narrow and a leakage current occurs due to the conductive byproducts (e.g., the second conductive byproduct layer RD_b1 of FIG. 12) generated between the memory cells MC by the trimming process. For example, the conductive byproducts generated between the memory cells MC by the trimming process may provide a leakage current path between adjacent memory cells (e.g., the first memory cell MC1 and the second memory cell MC2).

In order to solve this problem, an additional trimming process (e.g., the second trimming process E_H of FIGS. 13 and 14) for the upper surface of the lower insulating layer 105 may be performed. However, in this case, a problem may occur in that the conductive byproducts (e.g., the third conductive byproduct layer RD_S2 of FIG. 14) re-deposited on the sides of the memory cells MC are generated. Therefore, the trimming process (for example, the first trimming process E_L1 of FIGS. 11 and 12) for the sides of the memory cells MC is not performed with a required strength.

However, in the method for fabricating a magnetic memory device according to some embodiments, the trimming process (e.g., the first trimming process E_L1 or the third trimming process E_L2) for the sides of the memory cells MC may be sufficiently performed using the capping insulating layer 175. In detail, as described above with reference to FIGS. 17 and 18, the capping insulating layer 175 may cover the conductive byproducts (e.g., the third conductive byproduct layer RD_S2) re-deposited on the sides of the memory cells MC. The trimming process (e.g., the third trimming process E_L2) for the sides of the memory cells MC may be performed on the capping insulating layer 175. Therefore, before the re-deposition byproduct layer 166 generated from the third conductive byproduct layer RD_S2 is re-deposited, the capping insulating layer 175 and the mixed layer 164 may be preferentially re-deposited on the lower insulating layer 105. The capping insulating layer 175 and the mixed layer 164 may physically and electrically separate the conductive byproducts (e.g., the bottom byproduct layer RD_b2) formed on the lower insulating layer 105 from the re-deposition byproduct layer 166, thereby limiting the formation of the leakage current path between the memory cells MC. As a result, the trimming process (e.g., the first trimming process E_L1 of FIGS. 11 and 12) for the sides of the memory cells MC may be sufficiently performed with a required strength, and an electrical short between the magnetic patterns (e.g., the first magnetic pattern 130 and the second magnetic pattern 150) and a leakage current between adjacent memory cells (e.g., the first memory cell MC1 and the second memory cell MC2) may be reduced, whereby the magnetic memory device in which reliability is improved may be provided.

Although terms (e.g., first, second or third) may be used herein to describe various elements, these elements should not be limited by these terms. These terms are only used to distinguish one element from another. For example, a first element may be referred to as a second element, and, similarly a second element may be referred to as a first element without departing from the teachings of the disclosure.

As used herein, an element or region that is "covering" or "filling" another element or region may completely or partially cover or fill the other element or region.

While the present inventive concept has been particularly shown and described with reference to some example embodiments thereof, it will be understood by those of ordinary skill in the art that various changes in form and details may be made therein without departing from the scope of the present inventive concept as defined by the following claims. It is therefore desired that the example embodiments be considered in all respects as illustrative and not restrictive, reference being made to the appended claims rather than the foregoing description to indicate the scope of the invention.

What is claimed is:

1. A magnetic memory device comprising:

a substrate;

a lower insulating layer on the substrate;

a memory cell including a first magnetic pattern, a tunnel barrier pattern and a second magnetic pattern, which are sequentially stacked on the lower insulating layer; and a re-deposition insertion layer extending along an upper surface of the lower insulating layer from a side of the memory cell, wherein the re-deposition insertion layer includes a re-deposition insulating layer, a mixed layer and a re-deposition byproduct layer, which are sequentially stacked on the lower insulating layer, and the mixed layer includes both a material included in the re-deposition insulating layer and a material included in the re-deposition byproduct layer.

2. The magnetic memory device of claim 1, wherein the upper surface of the lower insulating layer includes a recess curved toward the substrate, and the re-deposition insertion layer extends along the recess.

3. The magnetic memory device of claim 1, wherein a width of the memory cell decreases with distance from the lower insulating layer.

4. The magnetic memory device of claim 1, wherein a thickness of the re-deposition insertion layer increases with distance from the memory cell.

5. The magnetic memory device of claim 1, further comprising a bottom byproduct layer interposed between the lower insulating layer and the re-deposition insulating layer.

6. The magnetic memory device of claim 1, further comprising a capping passivation layer extending along the side of the memory cell and an upper surface of the re-deposition insertion layer.

7. The magnetic memory device of claim 6, wherein the capping passivation layer includes a silicon nitride layer.

8. The magnetic memory device of claim 1, wherein the re-deposition insulating layer includes silicon nitride, the re-deposition byproduct layer includes a conductive metal material, and the mixed layer includes both the silicon nitride and the conductive metal material.

9. The magnetic memory device of claim 1, wherein the memory cell further includes a bottom electrode pattern interposed between the lower insulating layer and the first magnetic pattern, and a top electrode pattern on the second magnetic pattern.

10. The magnetic memory device of claim 1, further comprising:

a first conductive line that is electrically connected to the memory cell and is on the memory cell;

a selection element that is electrically connected to the memory cell and is on the substrate; and a second conductive line that is electrically connected to the selection element and is on the substrate.

11. A magnetic memory device comprising:

a substrate;

a lower insulating layer on the substrate;

a first memory cell and a second memory cell spaced apart from each other on the lower insulating layer, each of the first memory cell and the second memory cell including a first magnetic pattern, a tunnel barrier pattern and a second magnetic pattern sequentially stacked on the lower insulating layer;

a bottom byproduct layer on an upper surface of the lower insulating layer between the first memory cell and the second memory cell;

a re-deposition insulating layer on the bottom byproduct layer; and a re-deposition byproduct layer on the re-deposition insulating layer, the re-deposition byproduct layer being separated from the bottom byproduct layer by the re-deposition insulating layer.

12. The magnetic memory device of claim 11, wherein the upper surface of the lower insulating layer interposed between the first memory cell and the second memory cell includes a recess curved toward the substrate, and the re-deposition insulating layer extends along the recess.

13. The magnetic memory device of claim 11, wherein a width of each of the first memory cell and the second memory cell decreases with distance from the lower insulating layer.

14. The magnetic memory device of claim 11, wherein a thickness of the re-deposition insulating layer increases with distance from both of the first and second memory cells.

15. The magnetic memory device of claim 11, further comprising a mixed layer interposed between the re-deposition insulating layer and the re-deposition byproduct layer, wherein the mixed layer includes both a material included in the re-deposition insulating layer and a material included in the re-deposition byproduct layer.

16. The magnetic memory device of claim 11, wherein the re-deposition insulating layer includes a silicon nitride layer.

17. The magnetic memory device of claim 11, wherein each of the bottom byproduct layer and the re-deposition byproduct layer includes a conductive metal material.

18. A magnetic memory device comprising:

a substrate;

a lower insulating layer on the substrate;

a first memory cell and a second memory cell spaced apart from each other on the lower insulating layer;

a re-deposition insertion layer extending along an upper surface of the lower insulating layer between the first memory cell and the second memory cell;

a capping passivation layer extending along a side of each of the first memory cell and the second memory cell and an upper surface of the re-deposition insertion layer; and a filling insulating layer that is on the capping passivation layer and is in a space between the first memory cell and the second memory cell, wherein each of the first memory cell and the second memory cell includes a bottom electrode pattern, a first magnetic pattern, a tunnel barrier pattern, a second magnetic pattern and a top electrode pattern, which are sequentially stacked on the lower insulating layer, the re-deposition insertion layer includes a re-deposition insulating layer, a mixed layer and a re-deposition byproduct layer, which are sequentially stacked on the lower insulating layer, and the mixed layer includes both a material included in the re-deposition insulating layer and a material included in the re-deposition byproduct layer.

19. The magnetic memory device of claim 18, further comprising:

a first conductive line that electrically connects the top electrode pattern of the first memory cell to the top electrode pattern of the second memory cell and is on the filling insulating layer;

a selection element that is electrically connected to the bottom electrode pattern of the first memory cell and is on the substrate; and a second conductive line that is electrically connected to the selection element and is on the substrate.

20. The magnetic memory device of claim 18, wherein the upper surface of the lower insulating layer interposed between the first memory cell and the second memory cell includes a recess curved toward the substrate, and the re-deposition insulating layer extends along the recess.

* * * * *